(12) United States Patent
Lee

(10) Patent No.: US 11,812,615 B2
(45) Date of Patent: Nov. 7, 2023

(54) SEMICONDUCTOR MEMORY DEVICE AND MANUFACTURING METHOD OF THE SEMICONDUCTOR MEMORY DEVICE

(71) Applicant: SK hynix Inc., Icheon-si Gyeonggi-do (KR)

(72) Inventor: Nam Jae Lee, Icheon-si (KR)

(73) Assignee: SK hynix Inc., Icheon-si Gyeonggi-do (KR)

( * ) Notice: Subject to any disclaimer, the term of this patent is extended or adjusted under 35 U.S.C. 154(b) by 0 days.

(21) Appl. No.: 17/856,703

(22) Filed: Jul. 1, 2022

(65) Prior Publication Data

US 2022/0352202 A1 Nov. 3, 2022

Related U.S. Application Data

(62) Division of application No. 16/918,445, filed on Jul. 1, 2020, now Pat. No. 11,411,022.

(30) Foreign Application Priority Data

Jan. 15, 2020 (KR) ........................ 10-2020-0005632

(51) Int. Cl.
| | |
|---|---|
| *H10B 43/27* | (2023.01) |
| *H01L 21/67* | (2006.01) |
| *H01L 21/02* | (2006.01) |
| *H10B 43/35* | (2023.01) |
| *H10B 43/40* | (2023.01) |
| *H01L 23/522* | (2006.01) |
| *G11C 7/18* | (2006.01) |

(Continued)

(52) U.S. Cl.
CPC ............... *H10B 43/27* (2023.02); *G11C 7/18* (2013.01); *G11C 8/14* (2013.01);
(Continued)

(58) Field of Classification Search
CPC .......... G11C 7/18; G11C 8/14; G11C 16/0483; G11C 16/06; G11C 16/24; H10B 43/27;
(Continued)

(56) References Cited

U.S. PATENT DOCUMENTS

| | | |
|---|---|---|
| 7,183,607 B1 | 2/2007 | Lai et al. |
| 8,754,459 B2 | 6/2014 | Higuchi et al. |

(Continued)

FOREIGN PATENT DOCUMENTS

| | | |
|---|---|---|
| CN | 106856198 A | 6/2017 |
| CN | 109509756 A | 3/2019 |

(Continued)

*Primary Examiner* — Galina G Yushina
(74) *Attorney, Agent, or Firm* — WILLIAM PARK & ASSOCIATES LTD.

(57) ABSTRACT

There are provided a semiconductor memory device and a manufacturing method thereof. The semiconductor memory device includes: a cell stack structure surrounding a first channel structure and a second channel structure; a first source select line overlapping with a first region of the cell stack structure and surrounding the first channel structure; and a second source select line overlapping with a second region of the cell stack structure and surrounding the second channel structure. Each of the first source select line and the second source select line includes a first select gate layer overlapping with the cell stack structure, a second select gate layer disposed between the first select gate layer and the cell stack structure, and a third select gate layer disposed between the first select gate layer and the second select gate layer.

8 Claims, 29 Drawing Sheets

(51) Int. Cl.
  *H01L 29/06* (2006.01)
  *G11C 8/14* (2006.01)
  *H10B 41/20* (2023.01)
  *H10B 41/30* (2023.01)
  *H10B 43/10* (2023.01)

(52) U.S. Cl.
  CPC .. *H01L 21/02019* (2013.01); *H01L 21/67063* (2013.01); *H01L 23/5226* (2013.01); *H01L 29/0653* (2013.01); *H10B 41/20* (2023.02); *H10B 41/30* (2023.02); *H10B 43/10* (2023.02); *H10B 43/35* (2023.02); *H10B 43/40* (2023.02); *H01L 2221/1063* (2013.01)

(58) Field of Classification Search
  CPC ........ H10B 41/20; H10B 41/30; H10B 43/10; H10B 43/35; H10B 43/40; H10B 43/30; G10B 43/50; H01L 21/02019; H01L 21/67062; H01L 29/0653; H01L 2221/1063; H01L 29/66833; H01L 29/792
  See application file for complete search history.

(56) References Cited

U.S. PATENT DOCUMENTS

| | | | |
|---|---|---|---|
| 9,530,788 B2 | 12/2016 | Oginoe et al. | |
| 9,728,266 B1 | 8/2017 | Goda et al. | |
| 10,381,362 B1 | 8/2019 | Cui et al. | |
| 10,629,616 B1* | 4/2020 | Kai | H10B 43/10 |
| 10,644,018 B2 | 5/2020 | Lee et al. | |
| 10,665,580 B1* | 5/2020 | Hosoda | H10B 43/10 |
| 2005/0099847 A1* | 5/2005 | Ichige | H10B 41/30 |
| | | | 257/E27.103 |
| 2010/0123128 A1 | 5/2010 | Jeon et al. | |
| 2011/0073933 A1 | 3/2011 | Arai | |
| 2011/0217817 A1 | 9/2011 | Kim | |
| 2013/0240994 A1 | 9/2013 | Lee et al. | |
| 2014/0374879 A1 | 12/2014 | Chen et al. | |
| 2015/0370705 A1 | 12/2015 | Yoon et al. | |
| 2018/0358408 A1 | 12/2018 | Lee et al. | |
| 2018/0366483 A1 | 12/2018 | Choi | |
| 2018/0374869 A1 | 12/2018 | Kim et al. | |
| 2019/0164983 A1* | 5/2019 | Hu | H10B 41/35 |
| 2020/0027892 A1* | 1/2020 | Zhu | H10B 43/40 |
| 2020/0409592 A1 | 12/2020 | Yang et al. | |

FOREIGN PATENT DOCUMENTS

| | | |
|---|---|---|
| CN | 110098210 A | 8/2019 |
| JP | 2009032794 A | 2/2009 |
| KR | 1020040005686 A | 1/2004 |
| KR | 1020180137272 A | 12/2018 |
| KR | 1020190010403 A | 1/2019 |
| KR | 1020190051316 A | 5/2019 |

* cited by examiner

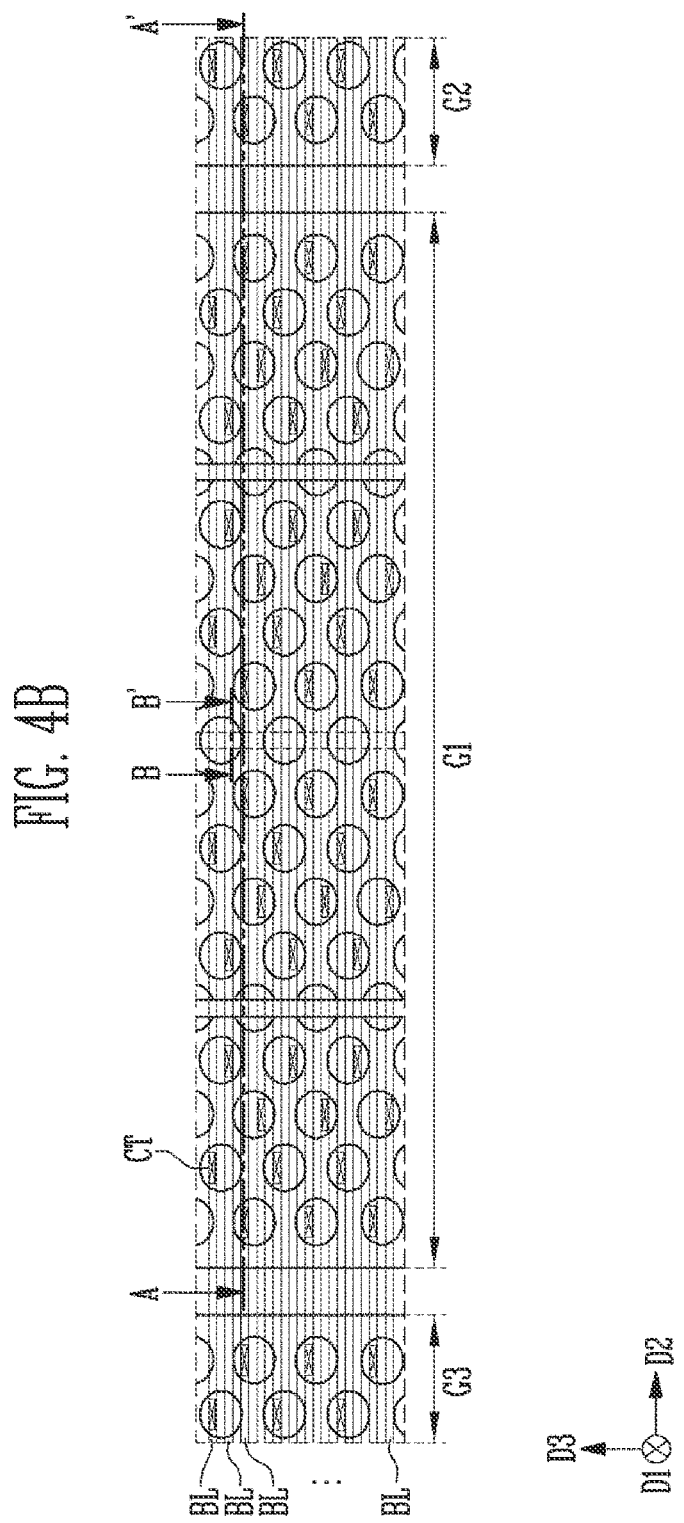

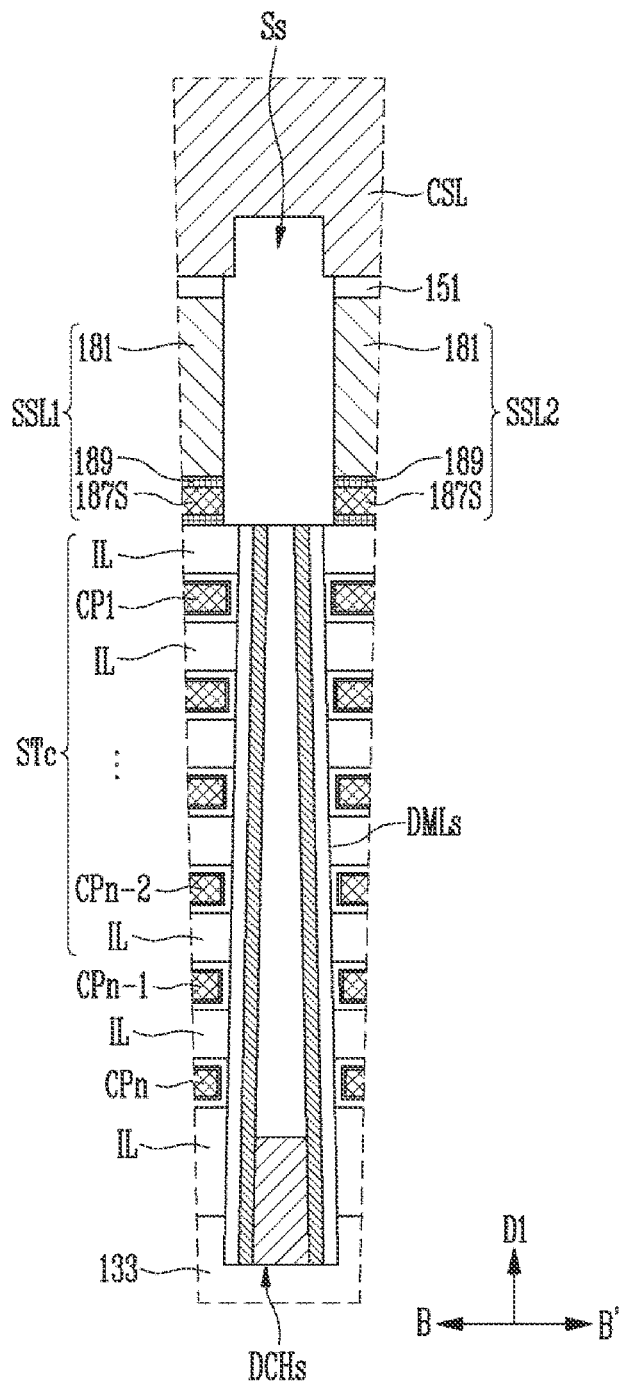

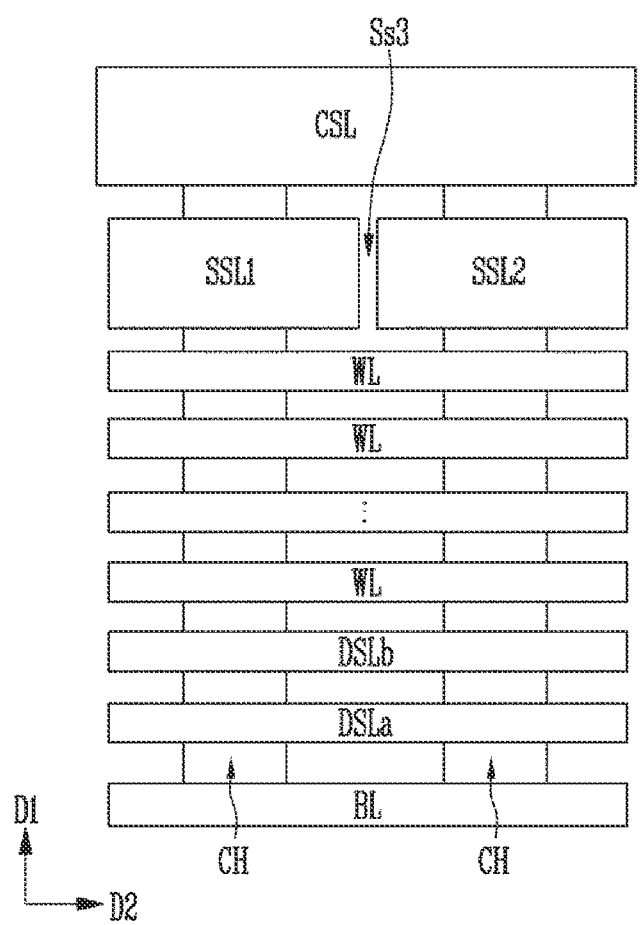

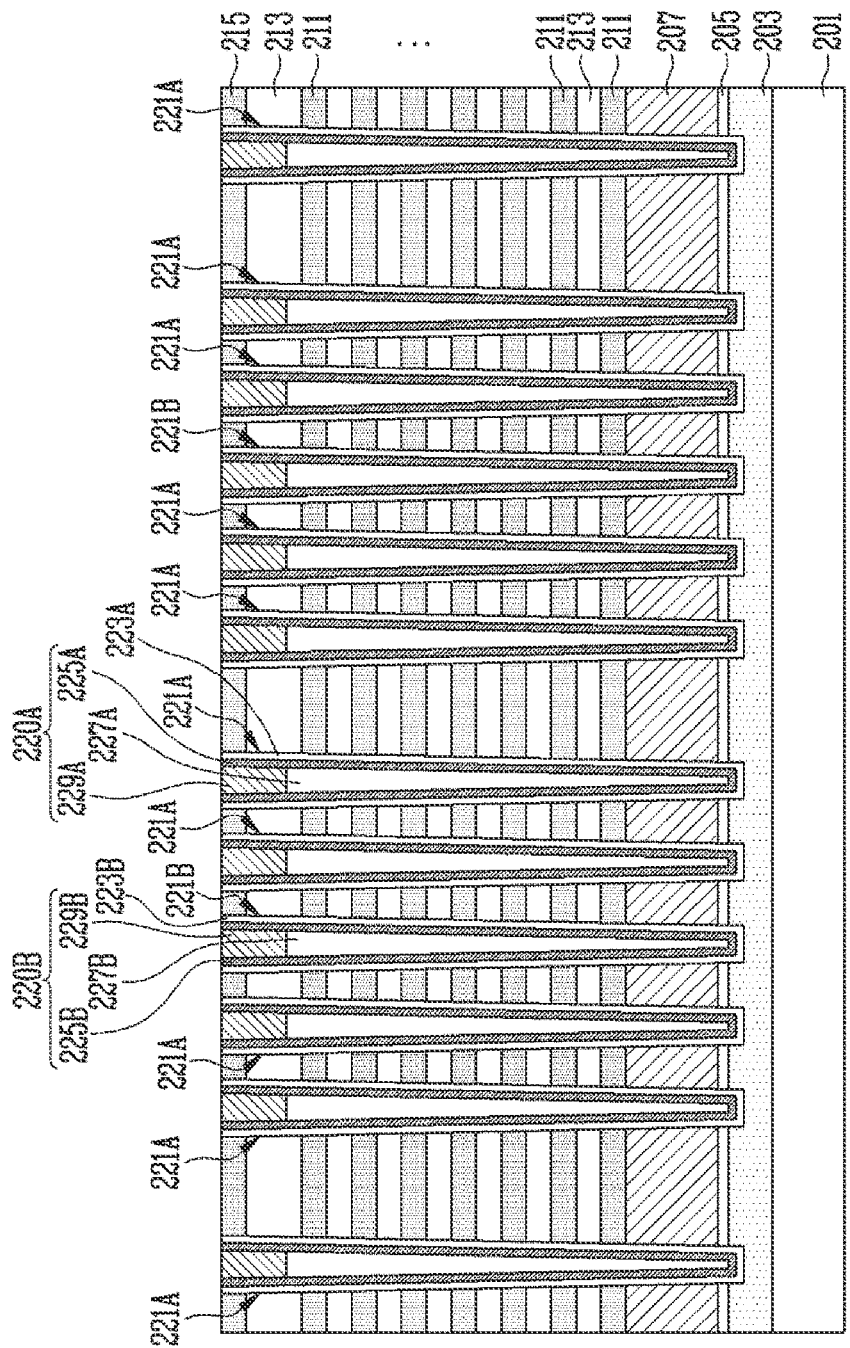

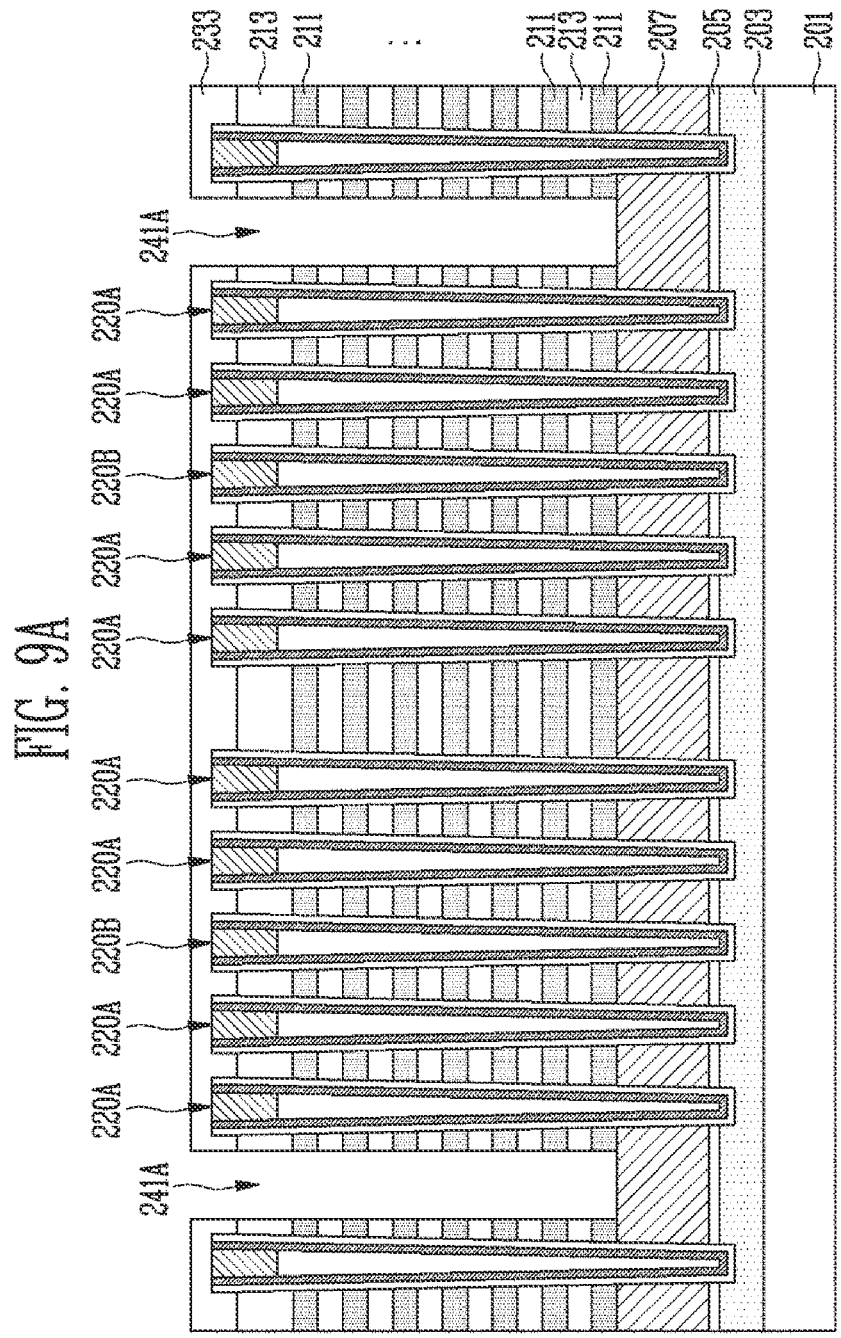

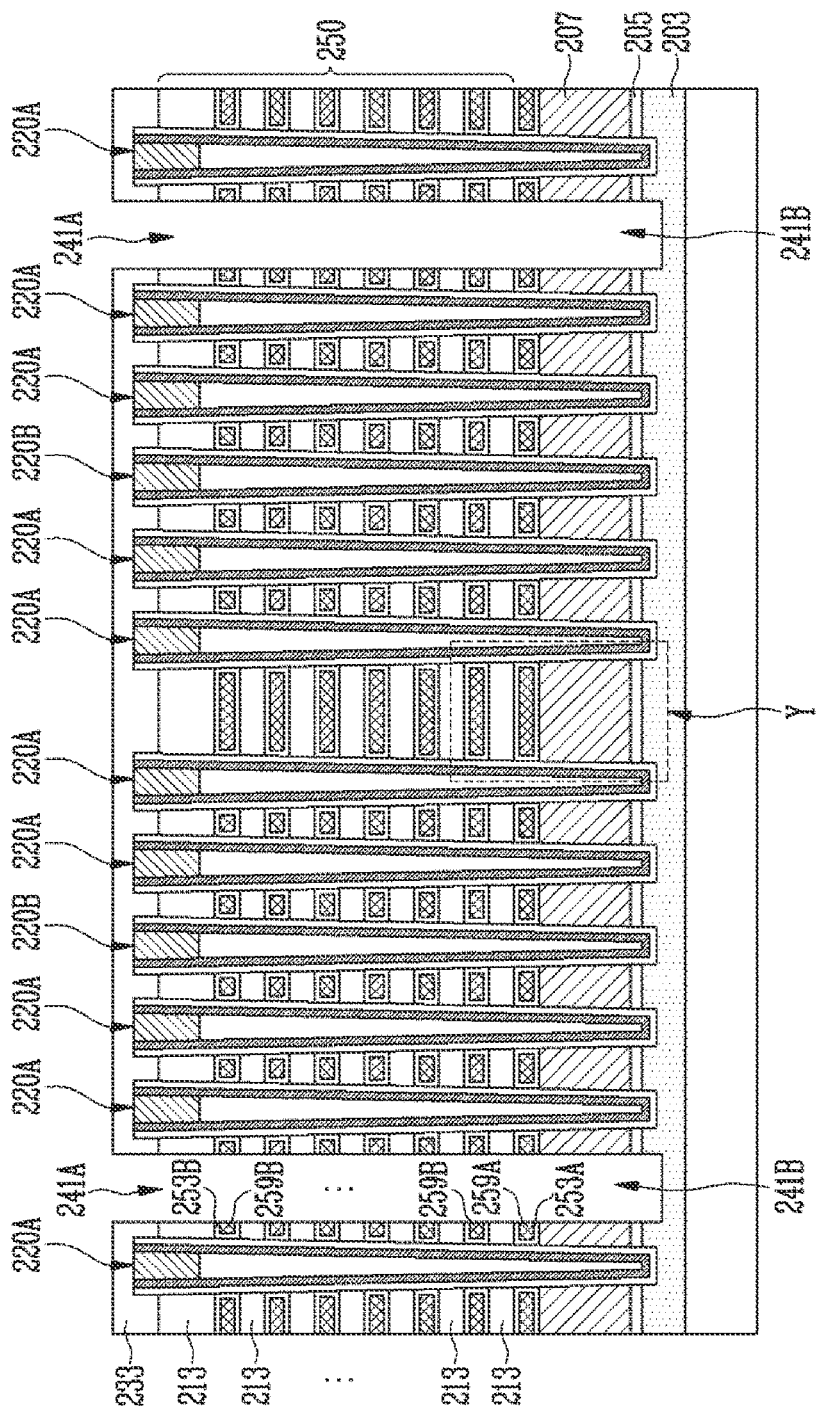

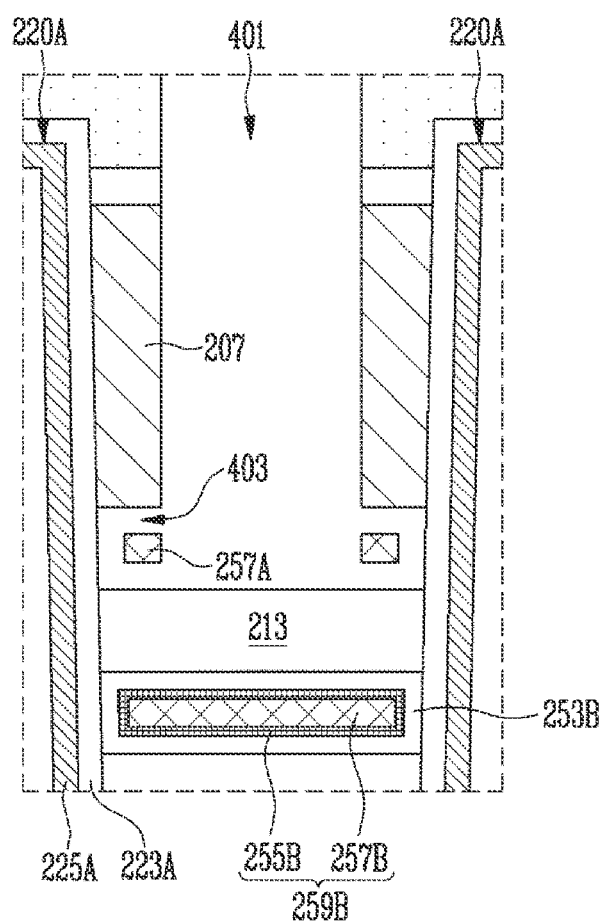

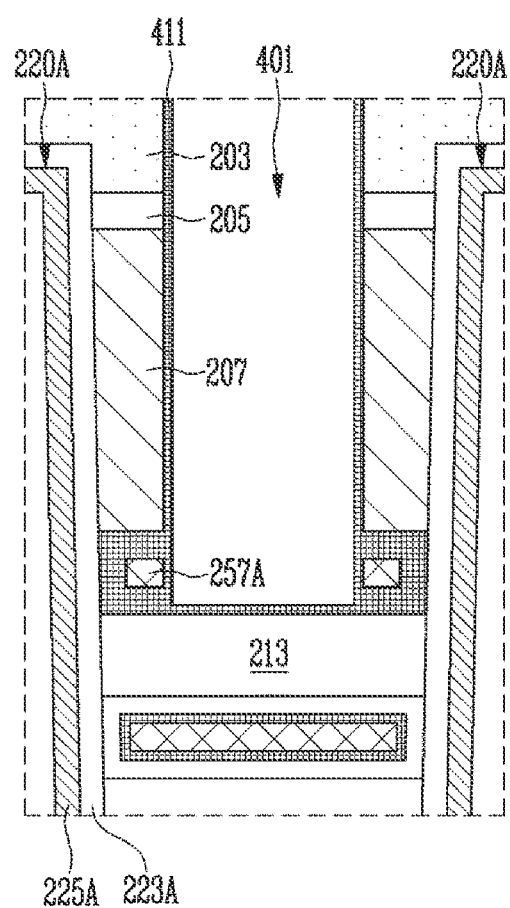

SEMICONDUCTOR MEMORY DEVICE AND MANUFACTURING METHOD OF THE SEMICONDUCTOR MEMORY DEVICE

CROSS-REFERENCE TO RELATED APPLICATION

The present application is a divisional application of U.S. patent application Ser. No. 16/918,445, filed on Jul. 1, 2020, and claims priority under 35 U.S.C. § 119(a) to Korean patent application number 10-2020-0005632, filed on Jan. 15, 2020, in the Korean Intellectual Property Office, the entire disclosure of which is incorporated herein by reference.

BACKGROUND

1. Technical Field

The present disclosure generally relates to a semiconductor memory device and a manufacturing method of the semiconductor memory device, and more particularly, to a three-dimensional semiconductor memory device and a manufacturing method of the three-dimensional semiconductor memory device.

2. Related Art

A semiconductor memory device includes a plurality of memory cells capable of storing data. The memory cells may be three-dimensionally arranged to implement a three-dimensional semiconductor memory device. The memory cells may constitute a plurality of cell strings. The cell strings may be connected to word lines and select lines.

SUMMARY

In accordance with an embodiment of the present disclosure, a semiconductor memory device may include a first channel structure and a second channel structure extending in a first direction; a cell stack structure including an interlayer insulating layer and a conductive pattern, which are alternately disposed in the first direction and extend to surround the first channel structure and the second channel structure; a first source select line overlapping with a first region of the cell stack structure and surrounding the first channel structure; and a second source select line overlapping with a second region of the cell stack structure and surrounding the second channel structure, wherein each of the first source select line and the second source select line includes a first select gate layer overlapping with the cell stack structure, a second select gate layer disposed between the first select gate layer and the cell stack structure, and a third select gate layer disposed between the first select gate layer and the second select gate layer.

In accordance with an embodiment of the present disclosure, a method of manufacturing a semiconductor memory device may include: forming a first select gate layer having a bottom surface facing a first substrate; forming a stack structure, wherein the stack structure includes a second select gate layer overlapping with the first select gate layer and interlayer insulating layers and conductive patterns, which are alternately stacked on the second select gate layer; removing the first substrate; and etching the first select gate layer and the second select gate layer from the bottom surface of the first select gate layer to form a slit penetrating the first select gate layer and the second select gate layer.

BRIEF DESCRIPTION OF THE DRAWINGS

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

FIGS. 4A and 4B are plan views illustrating gate stack structures.

FIG. 5B illustrates a section of the semiconductor memory device, taken along line B-B' shown in each of FIGS. 4A and 4B.

FIGS. 7A, 7B, and 7C are views illustrating various embodiments of the memory cell array.

FIGS. 8A, 8B, 9A, 9B, 9C, 10, 11, 12, 13, 14, 15A, 15B, 15C, 15D, 16A, 16B, and 16C are views illustrating a manufacturing method of the semiconductor memory device in accordance with an embodiment of the present disclosure.

DETAILED DESCRIPTION

The specific structural or functional descriptions disclosed herein are merely illustrative for the purpose of describing embodiments according to the concept of the present disclosure. The embodiments may be implemented in various forms, and should not be construed as being limited to the specific embodiments set forth herein.

Embodiments provide a semiconductor memory device capable of lowering the level of difficulty of manufacturing processes, and a manufacturing method of the semiconductor memory device.

Figure 1:
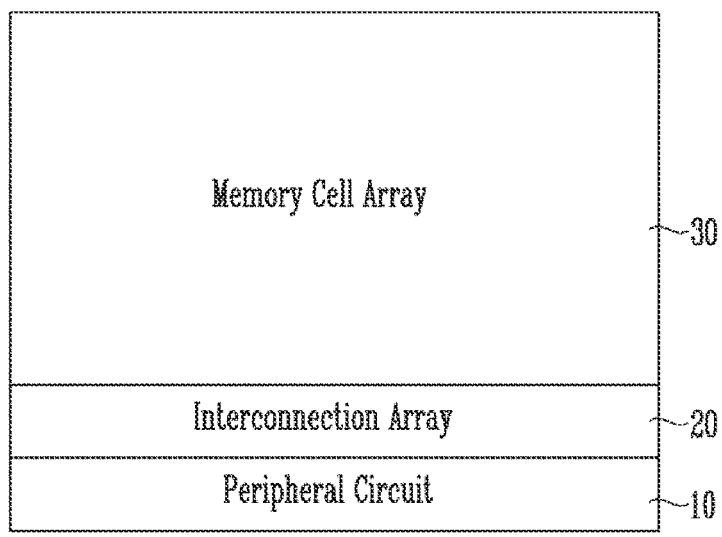
FIG. 1 is a block diagram illustrating a semiconductor memory device in accordance with an embodiment of the present disclosure.

FIG. 1 is a block diagram illustrating a semiconductor memory device in accordance with an embodiment of the present disclosure.

Referring to FIG. 1, the semiconductor memory device may include a peripheral circuit 10, an interconnection array 20, and a memory cell array 30.

The peripheral circuit 10 may include a row decoder, a column decoder, a sense amplifier, a control circuit, a page buffer circuit, and the like, which control an operation of the memory cell array 30. The drawing illustrates only a partial region of the peripheral circuit 10, which overlaps with the memory cell array 30, but the peripheral circuit 10 may include another region which does not overlap with the memory cell array 30.

The memory cell array 30 may include a plurality of cell strings connected to a common source line and a bit line.

The interconnection array 20 may include a first interconnection structure connected to the memory cell array 30 and a second interconnection structure connected to the peripheral circuit 10.

Figure 2:
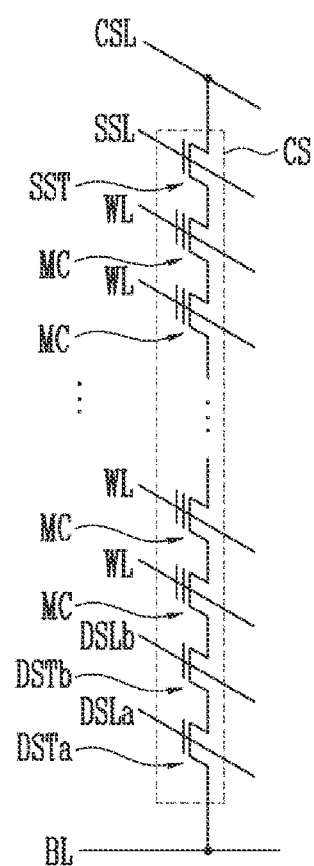
FIG. 2 is a circuit diagram illustrating a memory cell array shown in FIG. 1.

FIG. 2 is a circuit diagram illustrating the memory cell array 30 shown in FIG. 1.

Referring to FIG. 2, the memory cell array 30 may include a cell string CS connected to a common source line CSL and a bit line BL.

The cell string CS may include a plurality of memory cells MC, a source select transistor SST, and drain select transistors DSTa and DSTb, which are connected in series. The source select transistor SST may control electrical connection between the corresponding cell string and the common source line CSL. The drain select transistors DSTa and DSTb may control electrical connection between the corresponding cell string and the corresponding bit line BL. The cell string CS may include one drain select transistor or two or more drain select transistors connected in series. In an embodiment, the cell string CS may include a lower drain select transistor DSTa and an upper drain select transistor DSTb, which are connected in series.

The cell string CS may be connected to a source select line SSL, word lines WL, and drain select lines DSLa and DSLb. The source select line SSL may be connected to a gate electrode of the source select transistor SST, and the word lines WL may be respectively connected to gate electrodes of the memory cells MC. The drain select lines DSLa and DSLb may be respectively connected to gate electrodes of the drain select transistors DSTa and DSTb included in the cell string CS.

For convenience of description, FIG. 2 illustrates one cell string CS connected to the common source line CSL, but a plurality of cell strings may be connected in parallel to the common source line CSL. The plurality of cell strings may be arrange in rows and columns.

Hereinafter, the terms 'first' and 'second' are used to distinguish one component from another component. For example, a first component may be referred to as a second component without departing from a scope in accordance with the concept of the present disclosure and similarly, a second component may be referred to as a first component.

Figure 3:
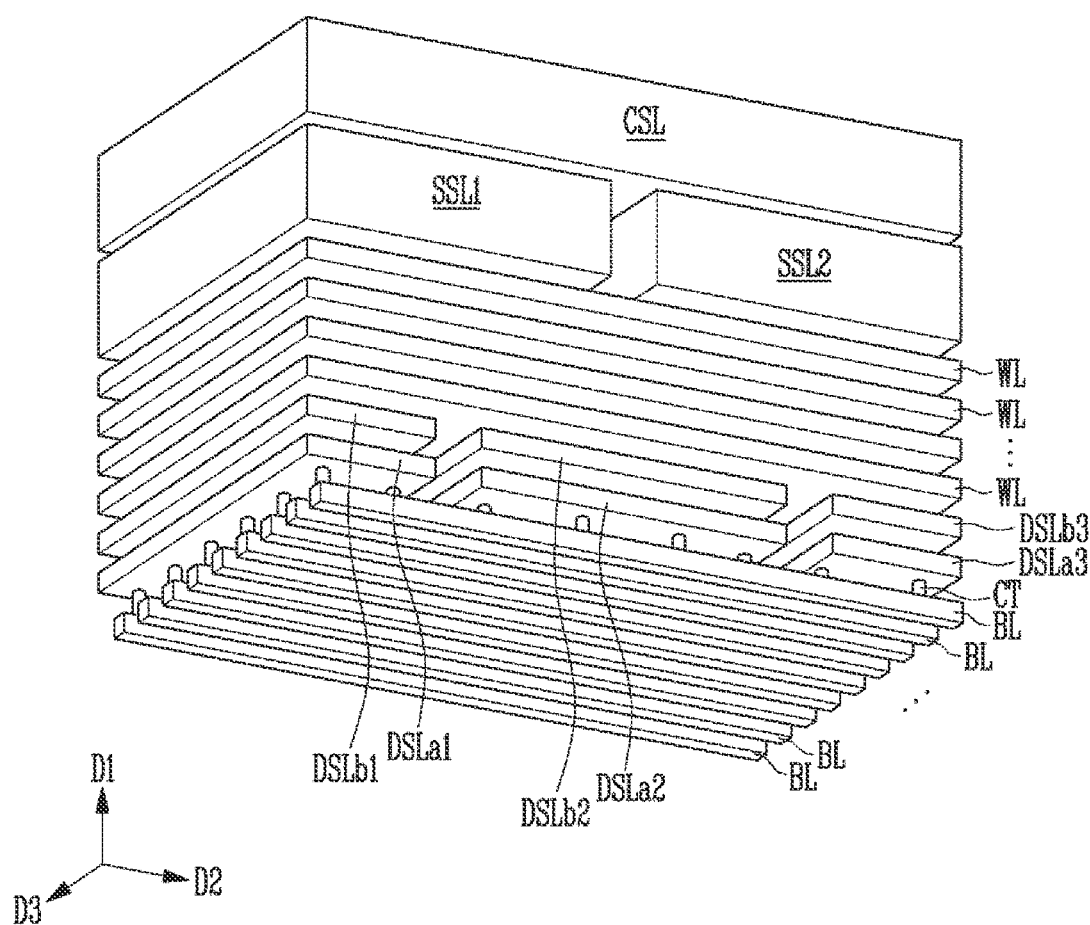
FIG. 3 is a perspective view illustrating an embodiment of the memory cell array shown in FIG. 2.

FIG. 3 is a perspective view illustrating an embodiment of the memory cell array 30 shown in FIG. 2. Hereinafter, a first direction D1 is defined as a direction in which word lines WL are stacked, a second direction D2 is defined as an extending direction of bit lines BL, and a third direction D3 is defined as a direction intersecting the bit lines BL.

The memory cell array 30 may include the bit lines BL, drain select lines DSLa1, DSLa2, DSLa3, DSLb1, DSLb2, and DSLb3, the word lines WL, source select lines SSL1 and SSL2, and a common source line CSL.

The bit lines BL may be arrange to be spaced apart from each other in the third direction D3, and extend in the second direction D2. Each of the bit lines BL may be connected to contact plugs CT. The contact plugs CT may electrically connect the bit lines BL to channel structures CH1 to CH4 shown in FIG. 4A.

The common source line CSL may expand in the second direction D2 and the third direction D3 to overlap with the bit lines BL.

The word lines WL may be disposed between the bit lines BL and the common source line CSL, and be stacked to be spaced apart from each other in the first direction D1. Each of the word lines WL may expand in the second direction D2 and the third direction D3 to overlap with the bit lines BL.

The drain select lines DSLa1, DSLa2, DSLa3, DSLb1, DSLb2, and DSLb3 may include a lower group DSLa1, DSLa2, and DSLa3 and an upper group DSLb1, DSLb2, and DSLb3, which are stacked between the word lines WL and the bit lines BL.

Each of the lower group DSLa1, DSLa2, and DSLa3 and the upper group Dan, DSLb2, and DSLb3 may include two or more drain select lines which are disposed at the same level and are spaced apart from each other. In an embodiment, the lower group DSLa1, DSLa2, and DSLa3 may include a first lower drain select line DSLa1, a second lower drain select line DSLa2, and a third lower drain select line DSLa3, which are disposed at the same level and are spaced apart from each other in the second direction D2. In addition, the upper group DSLb1, DSLb2, and DSLb3 may include a first upper drain select line DSLb1, a second upper drain select line DSLb2, and a third upper drain select line DSLb3, which are disposed at the same level and are spaced apart from each other in the second direction D2. However, the embodiments of the present disclosure is not limited thereto. In an embodiment, the upper group may include two or more-layered upper drain select lines arranged to be spaced apart from each other in the first direction D1.

The first lower drain select line DSLa1 and the first upper drain select line DSLb1 may be stacked to be spaced apart from each other in the first direction D1, and the third lower drain select line DSLa3 and the third upper drain select line DSLb3 may be stacked to be spaced apart fro each other in the first direction D1. The second lower drain do select line DSLa2 may be disposed between the first lower drain select line DSLa1 and the third lower drain select line DSLa3. The second upper drain select line DSLb2 may be disposed between the first upper drain select line DSLb1 and the third upper drain select line DSLb3. The second lower drain select line DSLa2 and the second upper drain select line DSLb2 may be stacked to be spaced apart from each other in the first direction D1.

Each word line WL may expand to overlap with the first, second, and third lower drain select lines DSLa1, DSLa2, and DSLa3. Each word line WL may overlap with the first, second and third upper drain select lines DSLb1, DSLb2, and DSLb3.

The source select lines SSL1 and SSL2 may be disposed between the word lines WL and the common source line CSL. Two or more source select lines spaced apart from each other at the same level may overlap with each word line WL. In an embodiment, the source select lines may include a first source select line SSL1 and a second source select line SSL2, which are spaced apart from each other in the second direction D2 at the same level.

The first source select line SSL1 may extend in the second direction D2 to overlap with the first lower drain select line DSLa1 and the first upper drain select line DSLb1 and to overlap with a portion of each of the second lower drain select line DSLa2 and the second upper drain select line DSLb2. The second source select line SSL2 may extend in the second direction D2 to overlap with the third lower drain select line DSLa3 and the third upper drain select line DSLb3 and to overlap with another portion of the second lower drain select line DSLa2 and the second upper drain select line DSLb2. An isolation region between the first source select line SSL1 and the second source select line SSL2 may overlap with the second lower drain select line DSLa2 and the second upper drain select line DSLb2.

The word lines WL, the first to third lower drain select lines DSLa1, DSLa2, and DSLa3, the first to third upper drain select lines DSLb1, DSLb2, and DSLb3, and the source select lines SSL1 and SSL2, which are described above, may constitute a gate stack structure.

Figure 4A:
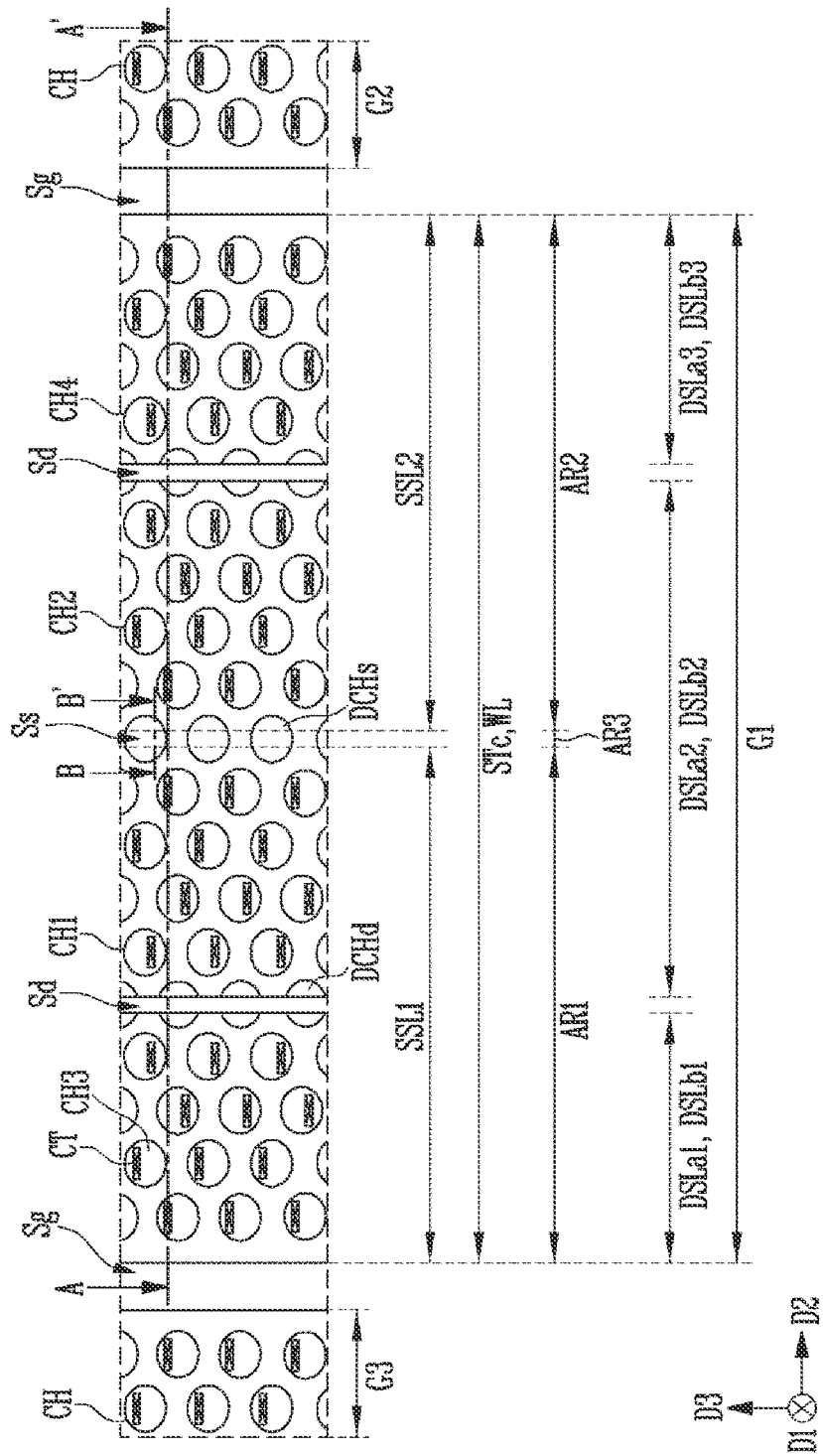

FIGS. 4A and 4B are plan views illustrating gate stack structures. FIG. 4A illustrates a first gate stack structure G1 and portions of a second gate stack structure G2 and a third gate stack structure G3, which are disposed at both sides of the first gate stack structure G1. FIG. 4B is a plan view illustrating a layout of the first to third gate stack structures G1 to G3 and bit lines BL.

Referring to FIG. 4A, the first to third gate stack structures G1 to G3 may be isolated from each other by gate isolation structures Sg. Each of the gate isolation structures Sg may extend in a third direction D3. Each of the first to third gate stack structures G1 to G3 may include the word lines WL, the first lower drain select line DSLa1, the second lower drain select line DSLa2, the third lower drain select line DSLa3, the first upper drain select line DSLb1, the second upper drain select line DSLb2, the third upper drain select line DSLb3, the first source select line SSL1, and the second source select line SSL2, which are described with respect to FIG. 3.

Hereinafter, the semiconductor memory device in accordance with an embodiment of the present disclosure will be described based on the word lines WL, the first to third lower drain select lines DSLa1 to DSLa3, the first to third upper drain select lines DSLb1 to DSLb3, and the first and second source select lines SSL1 and SSL2 of the first gate stack structure G1.

The word lines WL may be spaced apart from each other in a first direction D1 between gate isolation structures Sg adjacent to each other in a second direction D2, and constitute a cell stack structure STc. The cell stack structure STc may include a first region AR1, a second region AR2, and a third region AR3. The first region AR1 and the second region AR2 are regions adjacent to the respective gate isolation structures Sg adjacent to each other, and the third region AR3 is a region between the first region AR1 and the second region AR2.

The first region AR1 and the second region AR2 of the cell stack structure STc may respectively overlap with drain select isolation structures Sd. Each of the drain select isolation structures Sd may extend in the third direction D3.

The first region AR1 of the cell stack structure STc may overlap with the first lower drain select line DSLa1 and the first upper drain select line DSLb1 of the first gate stack structure G1. The first lower drain select line DSLa1 and the first upper drain select line DSLb1 may be disposed between a gate isolation structure Sg disposed at one side of the first gate stack structure G1 and a drain select isolation structure Sd adjacent to the gate isolation structure Sg.

The second region AR2 of the cell stack structure STc may overlap with the third lower drain select line DSLa3 and the third upper drain select line DSLb3 of the first gate stack structure G1. The third lower drain select line DSLa3 and the third upper drain select line DSLb3 may be disposed between a gate isolation structure Sg disposed at the other side of the first gate stack structure G1 and a drain select isolation structure Sd adjacent to the gate isolation structure Sg.

The third region AR3 of the cell stack structure STc may overlap with the second lower drain select line DSLa2 and the second upper drain select line DSLb2 of the second gate stack structure G1. The second lower drain select line DSLa2 and the second upper drain select line DSLb2 may extend toward the drain select isolation structures Sd disposed at both sides of the third region AR3, and overlap with the first region AR1 and the second region AR2 of the cell stack structure STc.

The first to third lower drain select lines DSLa1 to DSLa3 may be isolated from each other by the drain select isolation structures Sd disposed between the gate isolation structures Sg. The first to third upper drain select lines DSLb1 to DSLb3 of the first gate stack structure G1 may be isolated from each other by the drain select isolation structures Sd disposed between the gate isolation structures Sg.

The first source select line SSL1 of the first gate stack structure G1 may overlap with the first region AR1 of the cell stack structure STc. The second source select line SSL2 of the first gate stack structure G1 may overlap with the second region AR2 of the cell stack structure STc. The first source select line SSL1 and the second source select line SSL2 of the first gate stack structure G1 may be isolated from each other by a source select isolation structure Ss overlapping with the third region AR3 of the cell stack structure STc.

Each of the first to third gate stack structures G1 to G3 may be penetrated by channel structures CH and CH1 to CH4 extending in the first direction D1. In an embodiment, the channel structures CH1 to CH4 penetrating the first gate stack structure G1 may be divided into first channel structures CH1, second channel structures CH2, third channel structures CH3, and fourth channel structures CH4.

The first channel structures CH1 and the third channel structures CH3 may be surrounded by the first region AR1 of the cell stack structure STc and the first source select line SSL1. The third channel structures CH3 are farther spaced apart from the source select isolation structure Ss than the first channel structures CH1. The second channel structures CH2 and the fourth channel structures CH4 may be surrounded by the second region AR2 of the cell stack structure STc and the second source select line SSL2. The fourth channel structures CH4 are farther spaced apart from the source select isolation structure Ss than the second channel structures CH2.

The drain select isolation structures Sd may be disposed between the first channel structures CH1 and the third channel structures CH3 and between the second channel structures CH2 and the fourth channel structures CH4. The third channel structures CH3 may be surrounded by the first lower drain select line DSLa1 and the first upper drain select line DSLb1. The first channel structures CH1 and the second channel structure CH2 may be surrounded by the second lower drain select line DSLa2 and the second upper drain select line DSLb2. The fourth channel structures CH4 may be surrounded by the third lower drain select line DSLa3 and the third upper drain select line DSLb3.

The channel structures CH and CH1 to CH4 may respectively overlap with contact plugs CT. The arrangement of the channel structures CH and CH1 to CH4 and the arrangement of the contact plugs CT are not limited to those shown in the drawing, and may be variously modified.

The first gate stack structure G1 may be penetrated by dummy channel structures DCHd and DCHs extending in the first direction D1. The dummy channel structures may include a first dummy channel structure DCHs overlapping with the source select isolation structure Ss and second dummy channel structures DCHd overlapping with the respective drain select isolation structures Sd.

Referring to FIG. 4B, the first to third gate stack structures G1 to G3 may overlap with the bit lines BL. The bit lines BL may be connected to the channel structures CH and CH1 to CH4 described with reference to FIG. 4A through the contact plugs CT.

Figure 5A:
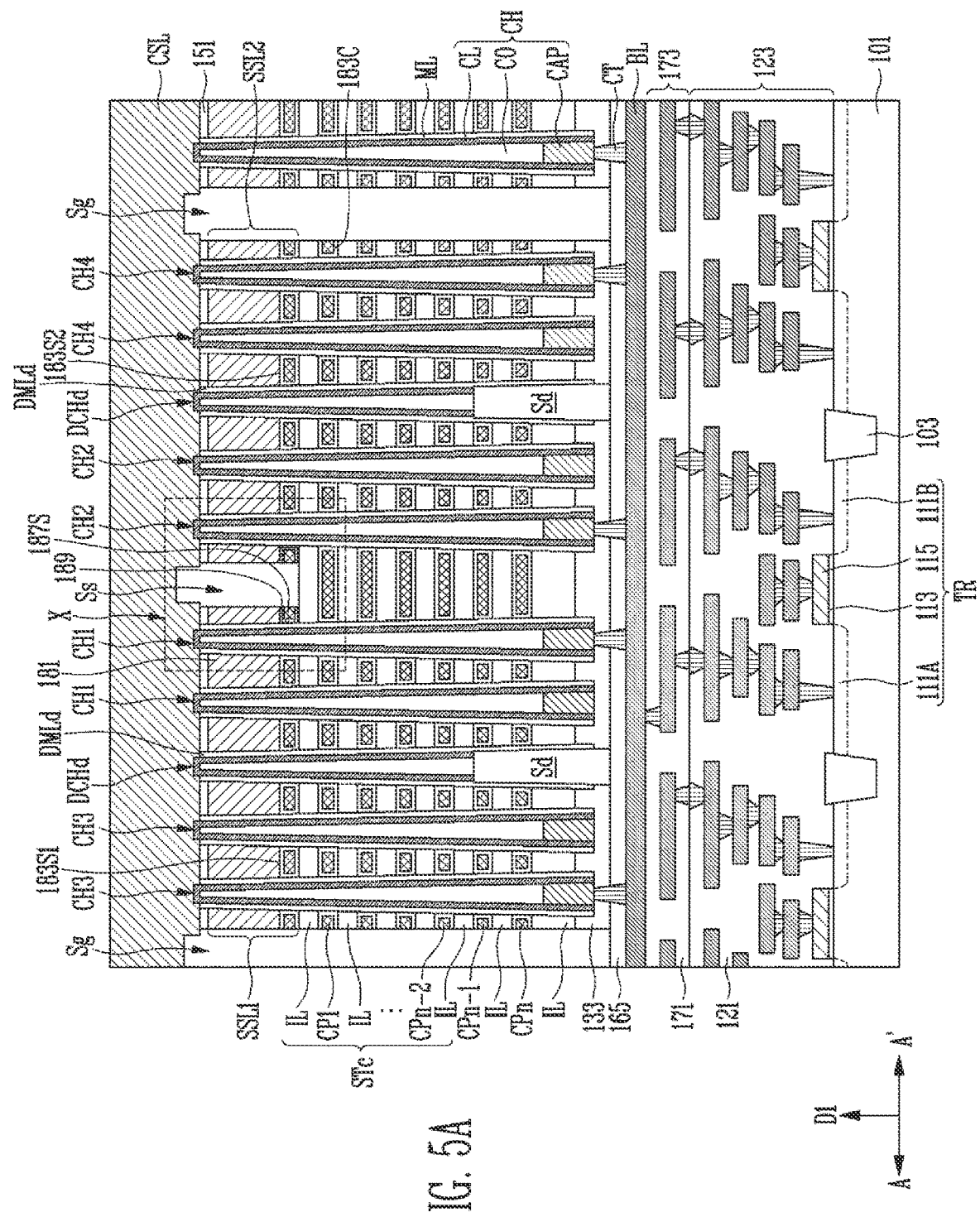
FIG. 5A illustrates a section of the semiconductor memory device, taken along line A-A' shown in each of FIGS. 4A and 4B.

FIG. 5A illustrates a section of the semiconductor memory device, taken along line A-A' shown in each of FIGS. 4A and 4B, and FIG. 5B illustrates a section of the semiconductor memory device, taken along line B-B' shown in each of FIGS. 4A and 4B.

Referring to FIG. 5A, the semiconductor memory device may include a common source line CSL and the bit line BL, which are disposed to be spaced apart from each other in the first direction D1 with the gate stack structures G1, G2, and G3 shown in FIG. 4A, which are interposed between the common source line CSL and the bit line BL. Also, the semiconductor memory device may include a substrate 101 including a peripheral circuit, and interconnection structures 123 and 173 between the substrate 101 and the bit line BL.

The peripheral circuit may include a plurality of transistors TR. The transistors TR may be disposed in active regions of the substrate 101, which are defined by isolation layers 103. Each of the transistors TR may include a gate insulating layer 113 disposed on an active region corresponding thereto, a gate electrode 115 disposed on the gate insulating layer 113, and junctions 111A and 111B formed in the active region at both sides of the gate electrode 115.

The peripheral circuit including the transistors TR may be connected to a memory cell array through the interconnection structures 123 and 173. The interconnection structures 123 and 173 may include first interconnection structures 123 connected to the memory cell array and second interconnection structures 173 connected to the transistors TR. The first interconnection structures 123 and the second interconnection structures 173 may be connected to each other. In an embodiment, the bit line BL may be connected to the corresponding transistor TR via a first interconnection structure 123 and a second interconnection structure 173, which are connected to each other.

The first interconnection structures 123 and the second interconnection structures 173 may include pad patterns, line patterns, and via plugs, which have various layouts. The first interconnection structures 123 may be formed in a first insulating structure 121, and the second interconnection structures 173 may be formed in a second insulating structure 171. The second insulating structure 171 may extend to cover the bit line BL between the bit line BL and the first insulating structure 121, and include multi-layered insulating layers. The first insulating structure 121 may extend to cover the peripheral circuit including the transistors TR, and include multi-layered insulating layers stacked on the substrate 101.

The bit line BL may be formed of various conductive materials. The bit line BL may be electrically connected to channel structures CH, CH1, CH2, CH3, and CH4 corresponding to the bit line BL via contact plugs CT.

The contact plugs CT may penetrate insulating layers 165 and 133 disposed between the bit line BL and the channel structures CH, CH1, CH2, CH3, and CH4. FIG. 5A illustrates the first to fourth channel structures CH1 to CH4 penetrating the first gate stack structure G1 shown in FIG. 4A and the channel structure CH penetrating the second gate stack structure G2 shown in FIG. 4A.

A sidewall of each of the channel structures CH, CH1, CH2, CH3, and CH4 may be surrounded by a memory layer ML. The memory layer ML may include a tunnel insulating layer, a data storage layer extending along an outer wall of the tunnel insulating layer, and a blocking insulating layer extending along an outer wall of the data storage layer. The data storage layer may be formed of a material layer capable of storing data. In an embodiment, the data storage layer may be formed of a material layer capable of storing data changed using Fowler-Nordheim tunneling. To this end, the data storage layer may be formed of a nitride layer in which charges can be trapped. However, the present disclosure is not limited thereto, and the data storage layer may include silicon, a phase change material, nano dots, and the like. The blocking insulating layer may include an oxide layer capable of blocking charges. The tunnel insulating layer may be formed of a silicon oxide layer through which charges can tunnel.

Each of the channel structures CH, CH1, CH2, CH3, and CH4 may include a channel layer CL, a core insulating layer CO, and a capping semiconductor layer CAP. The core insulating layer CO and the capping semiconductor layer CAP may be disposed in a central region of the corresponding channel structure. The core insulating layer CO may overlap with the capping semiconductor layer CAP. The capping semiconductor layer CAP may include a doped semiconductor layer. In an embodiment, the capping semiconductor layer CAP may include doped silicon including an n-type impurity. The channel layer CL may surround a sidewall of the capping semiconductor layer CAP and a sidewall of the core insulating layer CO. The channel layer CL may extend to a surface of the core insulating layer CO, which faces the common source line CSL. The channel layer CL may serve as a channel region of the cell string CS described with reference to FIG. 2. The channel layer CL may be formed of a semiconductor layer.

The channel layer CL of each of the first to fourth channel structures CH1 to CH4 penetrating the first gate stack structure G1 shown in FIG. 4A may be in contact with the common source line CSL. The common source line CSL may include a doped semiconductor layer. In an embodiment, the common source line CSL may include doped silicon including an n-type impurity. The common source line CSL may extend to overlap with the gate isolation structures Sg, the source select isolation structure Ss, the first source select line SSL1, and the second source select line SSL2.

A source gate insulating layer 151 may be disposed between the common source line CSL and each of the first source select line SSL1 and the second source select line SSL2. The source gate insulating layer 151 may be penetrated by the first to fourth channel structures CH1 to CH4, the gate isolation structures Sg, and the source select isolation structure Ss.

The first gate stack structure G1 shown in FIG. 4A may include interlayer insulating layers IL and conductive patterns CP1 to CPn (n is a natural number), which are alternately stacked in the first direction D1.

At least one-layered conductive pattern adjacent to the bit line BL among the conductive patterns CP1 to CPn may be penetrated by the drain select isolation structures Sd. In an embodiment, an nth conductive pattern CPn adjacent to the bit line BL and an (n−1)th conductive pattern CPn−1 between the nth conductive pattern CPn and the common source line CSL may be penetrated by the drain select isolation structures Sd. The nth conductive pattern CPn may be isolated, by the drain select isolation structures Sd, into the first lower drain select line DSLa1, the second lower drain select line DSLa2, and the third lower drain select line DSLa3, which are described with reference to FIGS. 3 and 4A. The (n−1)th conductive pattern CPn−1 may be isolated, by the drain select isolation structures Sd, into the first upper drain select line DSLb1, the second upper drain select line DSLb2, and the third upper drain select line DSLb3, which are described with reference to FIGS. 3 and 4A.

Conductive patterns CP1 to CPn-2 and interlayer insulating layers IL, which are alternately disposed in the first direction D1 between the drain select isolation structures Sd and the common source line CSL, may constitute the cell stack structure STc described with reference to FIG. 4A. The conductive patterns CP1 to CPn-2 of the cell stack structure STc may respectively form the word lines WL described with reference to FIGS. 3 and 4A. Each of the conductive patterns CP1 to CPn-2 and the interlayer insulating layers IL of the cell stack structure STc may extend to surround the first to fourth channel structures CH1 to CH4.

The first source line SSL1 may overlap with the cell stack structure STc, and extend to surround the first and third channel structures CH1 and CH3. A first blocking insulating pattern 183S1 may be buried in the first source select line SSL1. The second source select line SSL2 may overlap with the cell stack structure STc, and extend to surround the second and fourth channel structures CH2 and CH4. A second blocking insulating pattern 183S2 may be buried in the second source select line SSL2.

The conductive patterns CP1 to CPn may be formed of the same conductive material. A third blocking insulating pattern 183C may be formed on a surface of each of the conductive patterns CP1 to CPn.

The first blocking insulating pattern 183S1, the second blocking insulating pattern 183S2, and the third blocking insulating pattern 183C may be formed of the same insulating material. Each of the first blocking insulating pattern 183S1, the second blocking insulating pattern 183S2, and the third blocking insulating pattern 183C may include a high dielectric layer. In an embodiment, each of the first blocking insulating pattern 183S1, the second blocking insulating pattern 183S2, and the third blocking insulating pattern 183C may include an aluminum oxide layer ($Al_2O_3$).

Referring to FIGS. 5A and 5B, the conductive patterns CP1 to CPn and the interlayer insulating layers IL may be penetrated by a first dummy channel structure DCHs and second dummy channel structures DCHd.

The first dummy channel structure DCHs may overlap with the source select isolation structure Ss between the first source select line SSL1 and the second source select line SSL2. A sidewall of the dummy channel structure DCHs may be surrounded by a first dummy memory layer DMLs. The first dummy channel structure DCHs may be spaced from the common source line CSL and the first and second source select lines SSL1 and SSL2 by the source select isolation structure Ss. The first dummy channel structure DCHs may be spaced from the bit line BL by the insulating layer 133.

The second dummy channel structures DCHd may penetrate the first source select line SSL1 and the second source select line SSL2, respectively. Each of the second dummy channel structures DCHd may be surrounded by a second dummy memory layer DMLd.

Referring to FIG. 5B, each of the first source select line SSL1 and the second source select line SSL2 may include a first select gate layer 181, a second select gate layer 187S, and a third select gate layer 189. The first select gate layer 181 may overlap with the cell stack structure STc. The second select gate layer 187S may be disposed between the cell stack structure STc and the first select gate layer 181. The third select gate layer 189 may be disposed between the first select gate layer 181 and the second select gate layer 187S.

Referring to FIG. 5A, the third select gate layer 189 of the first source select line SSL1 may extend between the second select gate layer 187S of the first source select line SSL1 and the cell stack structure STc from a sidewall of the first channel structure CH1, which is adjacent to the source select isolation structure Ss. On a plane intersecting the first direction D1, a width W1 of the third select gate layer 189 of the first source select line SSL1, which is shown in FIG. 6, may be formed narrower than that of each of the second select gate layer 187S and the first select gate layer 181 of the first source select line SSL1.

The third select gate layer 189 of the second source select line SSL2 may extend between the second select gate layer 187S of the second source select line SSL2 and the cell stack structure STc from a sidewall of the second channel structure CH2, which is adjacent to the source select isolation structure Ss. On a plane intersecting the first direction D1, a width W2 of the third select gate layer 189 of the second source select line SSL2, which is shown in FIG. 6, may be formed narrower than that of each of the second select gate layer 187S and the first select gate layer 181 of the second source select line SSL2.

Figure 6:
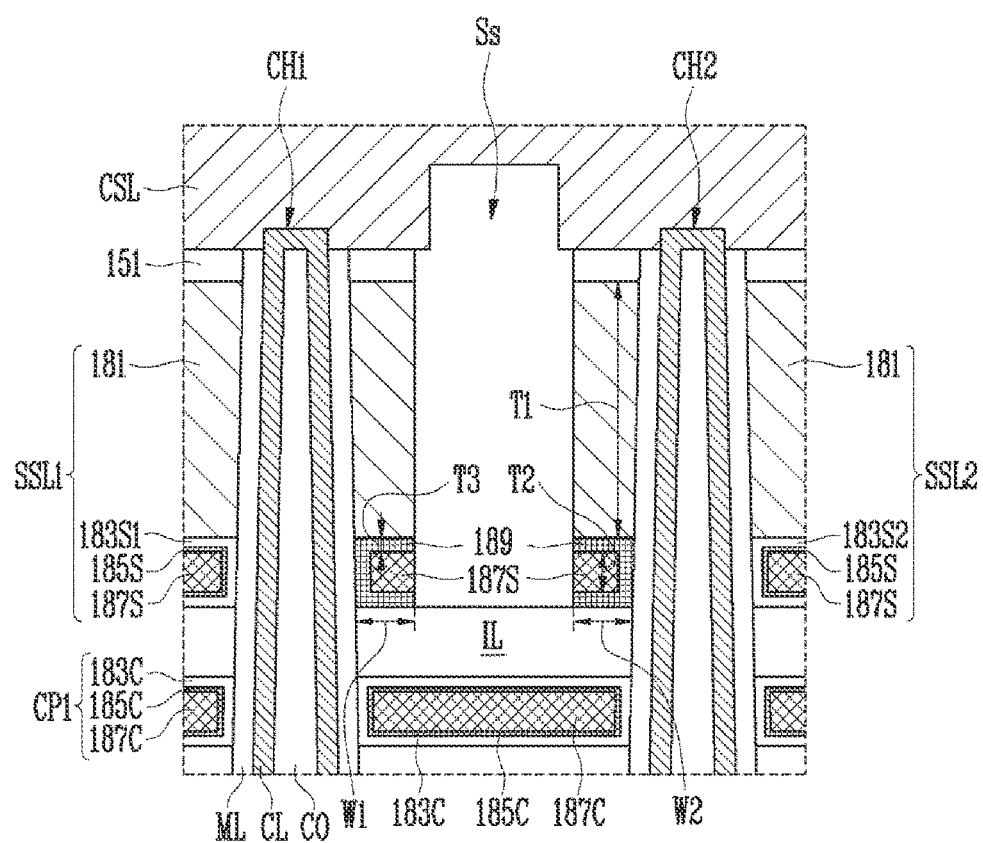
FIG. 6 is an enlarged view of region X shown in FIG. 5A.

FIG. 6 is an enlarged view of region X shown in FIG. 5A.

Referring to FIG. 6, the first select gate layer 181 of each of the first source select line SSL1 and the second source select line SSL2 may be formed of a material layer which can serve as an etch stop layer during a manufacturing process of the semiconductor memory device. In an embodiment, the first select gate layer 181 may include silicon. The first select gate layer 181 may be formed to have a thick thickness by considering a distance at which an impurity is diffused from the common source line CSL during the manufacturing process of the semiconductor memory device. In an embodiment, a thickness T1 of the first select gate layer 181 may be formed thicker than a thickness T2 of the second select gate layer 187S and a thickness T3 of the third select gate layer 189 of each of the first source select line SSL1 and the second source select line SSL2. The first select gate layer 181 of the first source select line SSL1 may extend to surround the first channel structures CH1, the third channel structures CH3, and the second dummy channel structure DCHd between the first channel structures CH1 and the third channel structures CH3 as shown in FIG. 5A. The first select gate layer 181 of the second source select line SSL2 may extend to surround the second channel structures CH2, the fourth channel structures CH4, and the second dummy channel structure DCHd between the second channel structures CH2 and the fourth channel structures CH4 as shown in FIG. 5A.

The second select gate layer 187S may be formed of a material layer which can lower resistance of the first source select line SSL1 and the second source select line SSL2. To this end, the second select gate layer 187S may include a conductive material having a resistance lower than those of the first select gate layer 181 and the third select gate layer 189. In an embodiment, the second select gate layer 187S may include tungsten. The second select gate layer 187S of the first source select line SSL1 may extend to surround the first channel structures CH1, the third channel structures CH3, and the second dummy channel structure DCHd between the first channel structures CH1 and the third channel structures CH3 as shown in FIG. 5A. The second select gate layer 187S of the second source select line SSL2 may extend to surround the second channel structures CH2, the fourth channel structures CH4, and the second dummy channel structure DCHd between the second channel structures CH2 and the fourth channel structures CH4 as shown in FIG. 5A.

The second select gate layer 187S may be formed of the same conductive material 187C constituting each of the conductive patterns CP1 to CPn shown in FIGS. 5A and 5B. In other words, the conductive material 187C constituting each of the conductive patterns CP1 to CPn may have a resistance lower than those of the first select gate layer 181 and the third select gate layer 189. In an embodiment, the conductive material 187C may include tungsten.

The third select gate layer 189 may provide an ohmic contact between the first select gate layer 181 and the second select gate layer 187S, and include a material which can serve as a diffusion barrier for preventing metal from being diffused from the second select gate layer 187S. In an embodiment, the third select gate layer 189 may include titanium (Ti) and titanium nitride (TiN), include titanium nitride (TiN), or include a titanium silicide material (TiSi). The third select gate layer 189 may be formed to have a thickness thinner than those of the first select gate layer 181 and the second select gate layer 187S.

The first blocking insulating pattern 183S1 may be disposed adjacent to the third select gate layer 189 of the first source select line SSL1 at the same level as the third select gate layer 189 of the first source select line SSL1, and surround a portion of the second select gate layer 187S of the first source select line SSL1. In an embodiment, the first blocking insulating pattern 183S1 may be disposed adjacent to the third select gate layer 189 of the first source select line SSL1 at substantially the same level as the third select gate layer 189 of the first source select line SSL1, and surround a portion of the second select gate layer 187S of the first source select line SSL1. In an embodiment, the first blocking insulating pattern 183S1 may surround a portion of the second select gate layer 187S of the first source select line SSL1 between the first channel structures CH1 and the gate isolation structure Sg as shown in FIG. 5A. The first blocking insulating pattern 183S1 may extend between the first select gate layer 181 and the second select gate layer 187S of the first source select line SSL1 and between the second select gate layer 187S of the first source select line SSL1 and an interlayer insulating layer IL adjacent to the second select gate layer 187S of the first source select line SSL1 from between the second select gate layer 187S and each of the first channel structures CH1, the third channel structures CH3, and the second dummy channel structure DCHd between the first channel structures CH1 and the third channel structures CH3. In an embodiment, the first blocking insulating pattern 183S1 may be disposed at a level that at least partially overlaps with a level of the third select gate layer 189 on a plane intersecting the first direction D1.

The second blocking insulating pattern 183S2 may disposed adjacent to the third select gate layer 189 of the second source select line SSL2 at the same level as the third select gate layer 189 of the second source select line SSL2, and surround a portion of the second select gate layer 187S of the second source select line SSL2. In an embodiment, the second blocking insulating pattern 183S2 may disposed adjacent to the third select gate layer 189 of the second source select line SSL2 at substantially the same level as the third select gate layer 189 of the second source select line SSL2, and surround a portion of the second select gate layer 187S of the second source select line SSL2. The second blocking insulating pattern 183S2 may surround a portion of the second select gate layer 187S of the second source select line SSL2 between the second channel structures CH2 and the gate isolation structure Sg as shown in FIG. 5A. The second blocking insulating pattern 183S2 may extend between the first select gate layer 181 and the second select gate layer 187S of the second source select line SSL2 and between the second select gate layer 187S of the second source select line SSL2 and an interlayer insulating layer IL adjacent to the second select gate layer 187S of the second source select line SSL2 from between the second select gate layer 187S and each of the second channel structures CH2, the fourth channel structures CH4, and the second dummy channel structure DCHd between the second channel structures CH2 and the fourth channel structures CH4. In an embodiment, the second blocking insulating pattern 183S2 may be disposed at a level that at least partially overlaps with a level of the third select gate layer 189 on a plane intersecting the first direction D1.

Each of the first source select line SSL1 and the second source select line SSL2 may further include a fourth select gate layer 185S having a thickness thinner than that of the third select gate layer 189. The fourth select gate layer 185S may include a material which can serve as a diffusion barrier for preventing metal from being diffused from the second select gate layer 187S. In an embodiment, the fourth select gate layer 185S may include titanium (Ti) and titanium nitride (TiN) or include titanium nitride (TiN). The fourth select gate layer 185S of the first source select line SSL1 may be disposed between the second select gate layer 187S of the first source select line SSL and the first blocking insulating pattern 183S1. The fourth select gate layer 185S of the second source select line SSL2 may be disposed between the second select gate layer 187S of the second source select line SSL2 and the second blocking insulating pattern 183S2.

The third blocking insulating pattern 183C may surround each of the conductive patterns CP1 to CPn shown in FIGS. 5A and 5B. The third blocking insulating pattern 183C may extend along surfaces of each of the conductive patterns CP1 to CPn, which face the first to fourth channel structures CH1 to CH4, the first dummy channel structure DCHs, the second dummy channel structures DCHd, and the interlayer insulating layers IL, which are shown in FIGS. 5A and 5B.

Each of the conductive patterns CP1 to CPn shown in FIGS. 5A and 5B may further include a diffusion barrier layer 185C formed of the same material as the fourth select gate layer 185S. The diffusion barrier layer 185C may be disposed between the conductive material 187C and the third blocking insulating pattern 183C.

The common source line CSL may be in contact with the channel layer CL penetrating the memory layer ML.

In an erase operation of the semiconductor memory device, gate induced drain leakage (GIDL) may occur at the common source line. In order to secure a GIDL current, a junction overlap region may be formed in a partial region of the channel layer CL adjacent to the common source line CSL. The junction overlap region may be formed by diffusing an impurity in the common source line CSL into the channel layer CL. The junction overlap region may be defined in various ranges according to a design of the semiconductor memory device. Although the diffusion distance of an impurity is increased so at to secure a stable junction overlap region, the junction overlap region is easily controlled not to excessively expand through the first select gate layer 181 having a relatively thick thickness. Accordingly, off-characteristics of source select transistors connected to the first and second source select lines SSL1 and SSL2 can be secured, and a stable GIDL current can be secured. As a result, the operational reliability of the semiconductor memory device can be ensured without increasing a stacking number of the source select transistors disposed between the common source line CSL and the word lines WL, which are shown in FIG. 2.

Figure 7A:
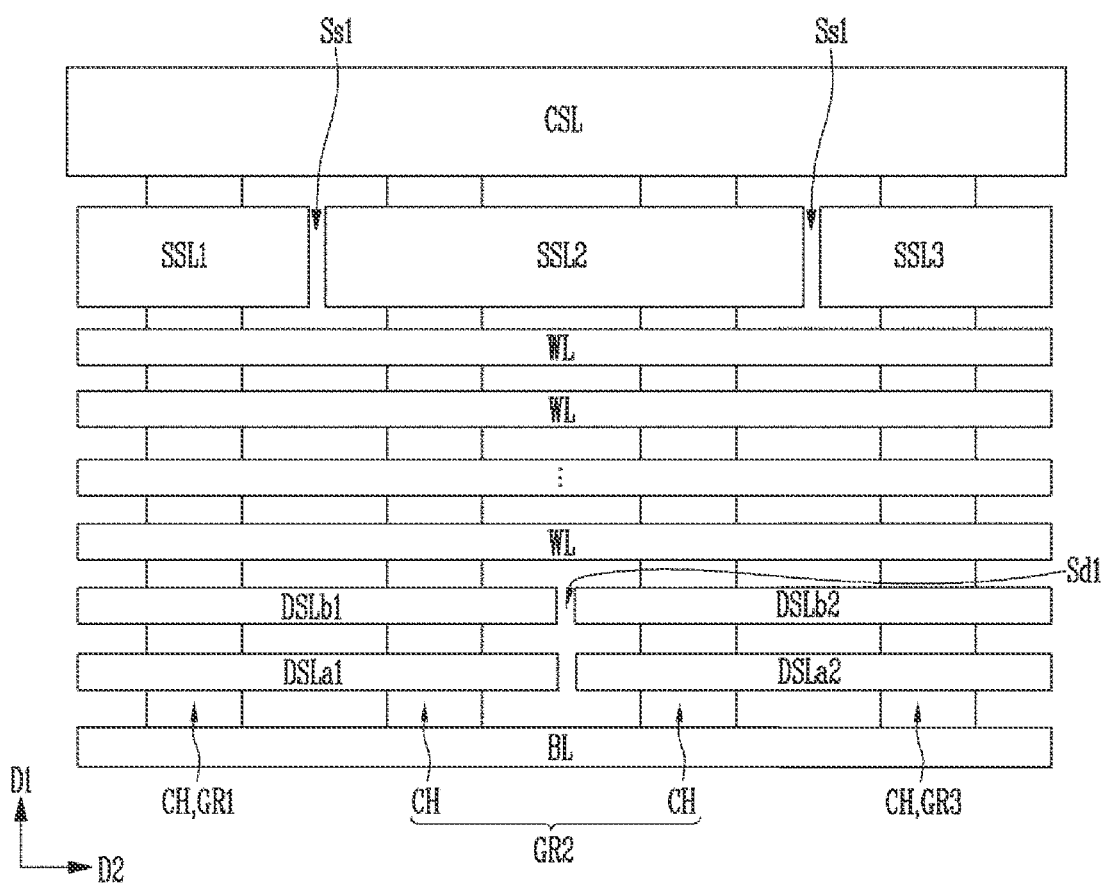
Figure 7B:
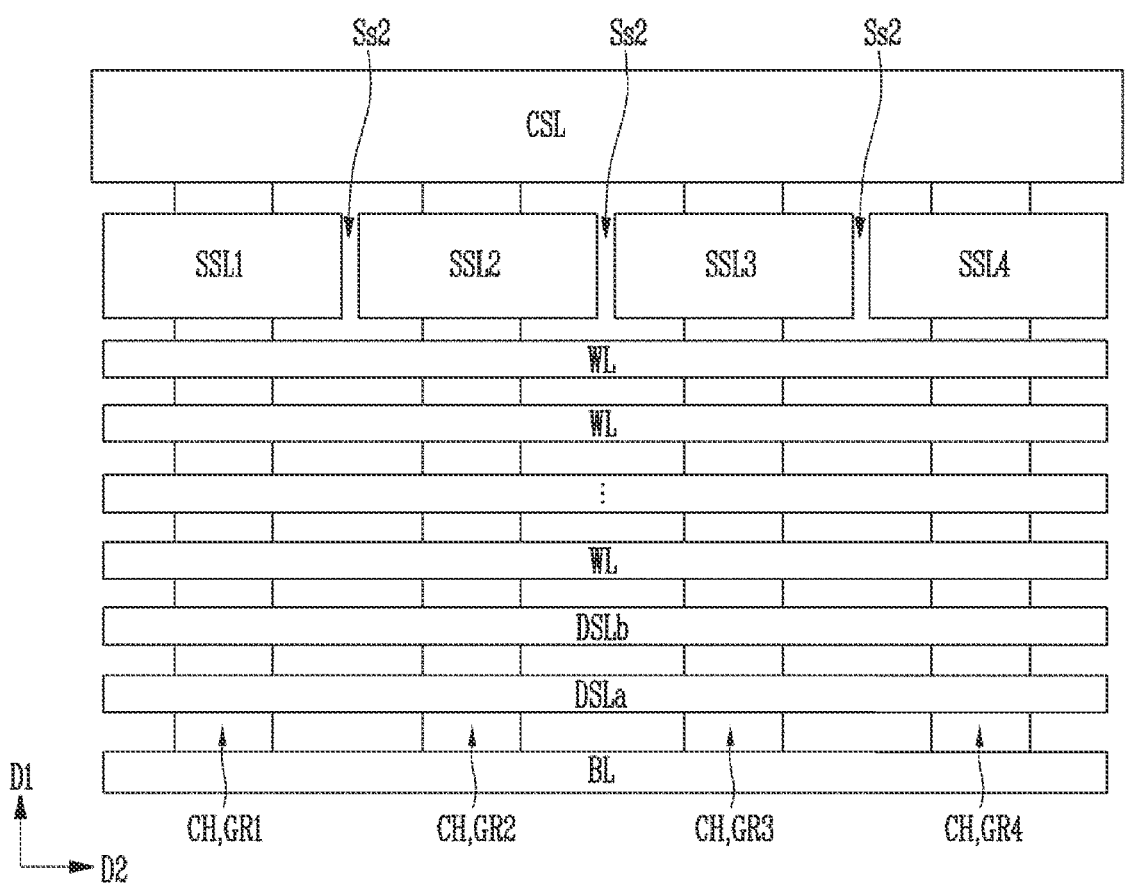

FIGS. 7A to 7C are views illustrating various embodiments of the memory cell array.

Referring to FIGS. 7A and 7C, each of memory cell arrays may include channel structures CH connected between a common source line CSL and a bit line BL. FIGS. 7A to 7C illustrate channel structures CH which can be simultaneously controlled by each of word lines WL spaced apart from each other.

In order to enable the above-described channel structures CH to be individually selected, a layout of source select lines SSL1, SSL2, SSL3, SSL4 and drain select lines DSLa1, DSLa2, DSLa, DSLb1, DSLb2, and DSLb may be variously designed.

Referring to FIG. 7A, in an embodiment, the channel structures CH may be divided into first to third groups GR1 to GR3 which can be respectively controlled by first to third source select lines SSL1 to SSL3 isolated from each other by source select isolation structures Ss1. The channel structure CH of the first group GR1 controlled by the first source select line SSL1 and some of the channel structures CH of the second group GR2 controlled by the source select line SSL2 may be simultaneously controlled by each of drain select lines DSLa1 and DSLb1 of a first group. The channel structure CH of the third group GR3 controlled by the third source select line SSL3 and other some of the channel structures CH of the second group GR2 controlled by the source select line SSL2 may be simultaneously controlled by each of drain select lines DSLa2 and DSLb2 of a second group. The drain select lines DSLa1 and DSLb1 of the first group may be isolated from the drain select lines DSLa2 and DSLb2 of the second group by a drain select isolation structure Sd1.

Referring to FIG. 7B, in an embodiment, the channel structures CH may be divided into first to fourth groups GR1 to GR4 which can be respectively controlled by first to fourth source select lines SSL1 to SSL4 isolated from each other by source select isolation structures Ss2. The channel structure CH of the first group GR1 controlled by the first source select line SSL, the channel structures CH of the second group GR2 controlled by the second source select line SSL2, the channel structure CH of the third group GR3 controlled by the third source select line SSL3, and the channel structure CH of the fourth group GR4 controlled by the fourth source select line SSL4 may be simultaneously controlled by each of drain select lines DSLa and DSLb.

Referring to FIGS. 7A to 7C, a number of channel structures CH commonly connected to the bit line BL among channel structures CH commonly controlled by each of the word lines WL may be variously changed.

In an embodiment, as shown in FIGS. 7A and 7B, channel structures CH of four columns may be commonly controlled by each of the word lines WL, and be commonly connected to the bit line BL.

In an embodiment, as shown in FIG. 7C, channel structures CH of two columns may be commonly controlled by each of the word lines WL, and be commonly connected to the bit line BL. The channel structures CH of the two columns may be controlled for each column through a first source select line SSL1 and a second source select line SSL2, which are spaced apart from each other through a source select isolation structure Ss3. The channel structures CH of the two columns may be simultaneously controlled by each of drain select lines DSLa and DSLb.

As described with reference to FIGS. 7A to 7C, the source select isolation structures Ss1, Ss2, and Ss3 and the drain select isolation structure Sd1 may be variously changed, apart from the embodiments shown in FIG. 4A.

Each of the first to fourth source select lines SSL1 to SSL4 shown in FIGS. 7A to 7C may have an end portion adjacent to the source isolation structure Ss1, Ss2 or Ss3. The end portion of each of the first to fourth source select lines SSL1 to SSL4 may include the first select gate layer 181, the second select gate layer 187S, and the third select gate layer 189, which are described with reference to FIGS. 5A, 5B, and 6.

FIGS. 8A, 8B, 9A, 9B, 9C, 10, 11, 12, 13, 14, 15A, 15B, 15C, 15D, 16A, 16B, and 16C are views illustrating a manufacturing method of the semiconductor memory device in accordance with an embodiment of the present disclosure.

Figure 8A:
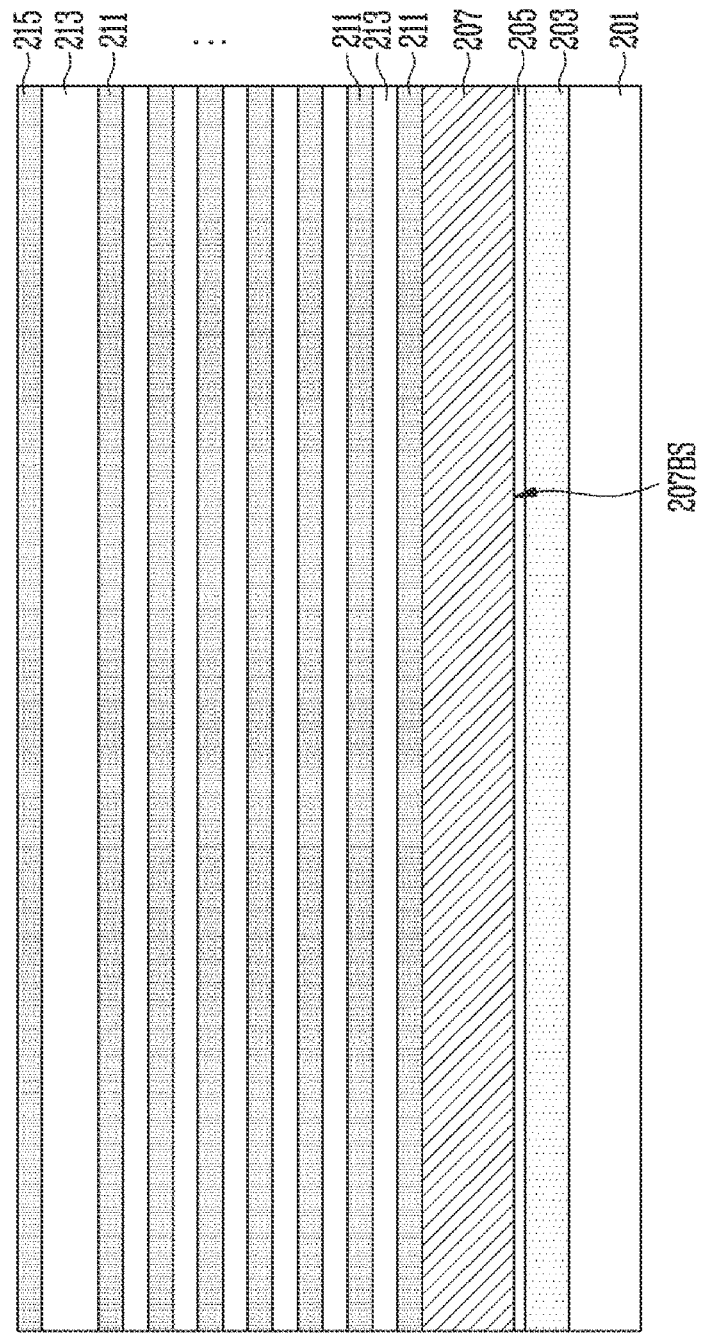

FIGS. 8A and 8B are sectional views illustrating a process of forming channel structures 220A and dummy channel structures 220B.

Referring to FIG. 8A, a first protective layer 203, an oxide layer 205, and a first select gate layer 207 may be sequentially stacked on a first substrate 201.

The first protective layer 203 may be formed of a material which can serve as a stop layer when a planarization process for removing the first substrate 201 is performed in a subsequent process. In an embodiment, the first protective layer 203 may include nitride.

The first select gate layer 207 may be used as a gate electrode, and be formed of a material which can serve as an etch stop layer in a subsequent process. In an embodiment, the first select gate layer 207 may include silicon. The first select gate layer 207 may have a bottom surface 207BS facing the first substrate 201.

Subsequently, sacrificial layers 211 and interlayer insulating layers 213 may be alternately stacked one by one ort the first select gate layer 207. A lowermost layer among the sacrificial layers 211 may be disposed to be in contact with the first select gate layer 207. The sacrificial layers 211 may include silicon nitride, and the interlayer insulating layers 213 may include silicon oxide.

Subsequently, a second protective layer 215 may be formed on a stack structure of the sacrificial layers 211 and the interlayer insulating layers 213. The second protective layer 215 may include nitride.

Referring to FIG. 8B, channel holes 221A may be formed, which penetrates the second protective layer 215, the interlayer insulating layers 213, the sacrificial layers 211, the first select gate layer 207, and the oxide layer 205, and exposes the first protective layer 205. Dummy holes 221B may be formed while the channel holes 221A are being formed. The arrangement of the channel holes 221A may be variously changed depending on a design of the semiconductor memory device. The dummy holes 221B may be omitted according to the design of the semiconductor memory device.

Subsequently, a memory layer 223A may be formed on a surface of each of the channel holes 221A. The memory layer 223A may include a blocking insulating layer, a data storage layer, and a tunnel insulating layer, which are sequentially stacked on the surface of each of the channel holes 221A. While the memory layer 223A is being formed, a dummy memory layer 223B may be formed on a surface of each of the dummy holes 221B. The dummy memory layer 223B may be made of the same materials as the memory layer 223A.

Subsequently, the channel structures 220A may be formed, which fill central regions of the channel holes 221A.

Each of the channel structures 220A may be formed on the corresponding memory layer 223A. The process of forming the channel structures 220A may include forming a channel layer 225A on the memory layer 223A, forming a core insulating layer 227A on the channel layer 225A, recessing a portion of the core insulating layer 227A, forming a capping semiconductor layer 229A on the recessed core insulating layer 227A, and performing a planarization process such that the second protective layer 215 is exposed. The channel layer 225A may include a semiconductor layer. In an embodiment, the channel layer 225A may include silicon. The core insulating layer 227A may include oxide. The capping semiconductor layer 229A may include a doped semiconductor layer including an n-type impurity. In an embodiment, the capping semiconductor layer 229A may include n-type doped silicon. While the channel structures 220A are being formed, a dummy channel structure 220B may be formed on the dummy memory layer 223B of each of the dummy holes 221B. The dummy channel structure 220B may include a dummy channel layer 225B formed of the same material as the channel layer 225A, a dummy core insulating layer formed of the same material as the core insulating layer 227A, and a dummy capping semiconductor layer 229B formed of the same material as the capping semiconductor layer 229A.

Figure 9B:
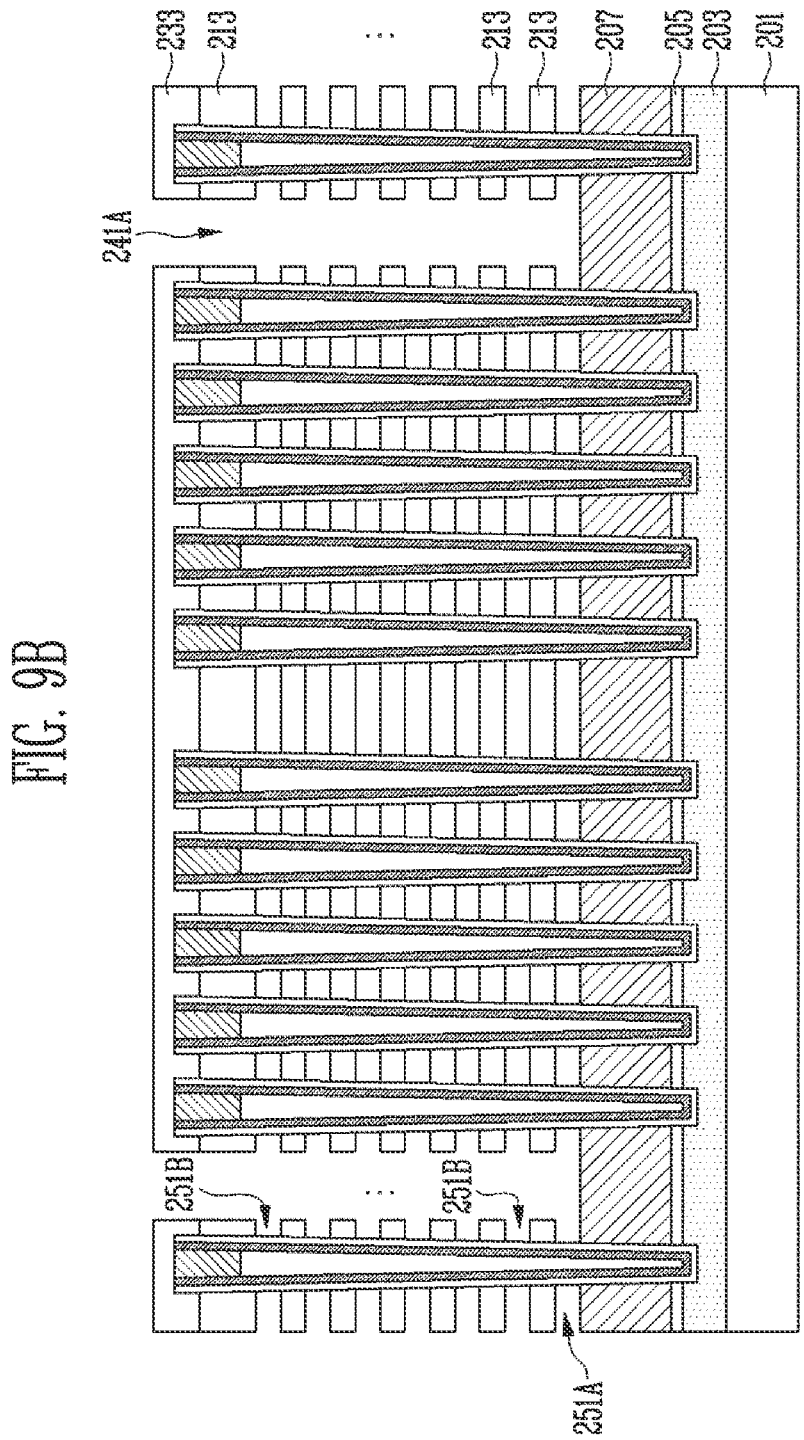

FIGS. 9A to 9C are sectional views illustrating a process of forming second select gate layer 259A and a stack structure 250.

Referring to FIG. 9A, after the second protective layer 215 shown in FIG. 8B is removed, a first upper insulating layer 233 may be formed, which covers the channel structures 220A and the dummy channel structures 220B.

Subsequently, a first slit 241A may be formed to penetrate the first upper insulating layer 233, the interlayer insulating layers 213, and the sacrificial layers 211. The first select gate layer 207 may be used as an etch stop layer during an etching process for forming the first slit 241A.

Referring to FIG. 9B, horizontal spaces 251A and 251B may be opened by selectively removing the sacrificial layers 211 shown in FIG. 9A through the first slit 241A. The horizontal spaces 251A and 251B may include a first horizontal space 251A and second horizontal spaces 251B. The first horizontal space 251A may be defined between the first select gate layer 207 and a lowermost layer among the interlayer insulating layers 213. The second horizontal spaces 251B may be defined between adjacent interlayer insulating layers 213 in a stacking direction of the interlayer insulating layers 213.

Referring to FIG. 9C, a second select gate layer 259A may be formed in the first horizontal space 251A shown in FIG. 9B through the first slit 241A. The second horizontal spaces 251B shown in FIG. 9B may be respectively filled with conductive patterns 259B formed of the same material as the second select gate layer 259A.

The process of forming the second select gate layer 259A and the conductive patterns 259B may include forming a blocking insulating layer on a surface of each of the first horizontal space 251A and the second horizontal spaces 251B, forming a conductive material filling each of the first horizontal space 251A and the second horizontal spaces 251B on a surface of the blocking insulating layer, and removing the conductive material in the first slit 241A such that the conductive material can be isolated into the second select gate layer 259A and the conductive patterns 259B.

The blocking insulating layer may include a first block insulating pattern 253A and second blocking insulating patterns 253B. The first blocking insulating pattern 253A may remain on the surface of the first horizontal space 251A shown in FIG. 9A, and the second blocking insulating patterns 253B may remain on the surfaces of the second horizontal spaces 251B shown in FIG. 9B.

The second select gate layer 259A may overlap with the first select gate layer 207. The interlayer insulating layers 213 and the conductive patterns 259B may be alternately stacked on the second select gate layer 259A, to constitute a stack structure 250.

Subsequently, a second slit 241B penetrating the first select gate layer 207 and the oxide layer 205 may be formed through the first slit 241A. The first slit 241A and the second slit 241B may constitute the gate isolation structure Sg shown in FIGS. 4A and 5A. The second slit 241B may expose the first protective layer 203.

Figure 10:
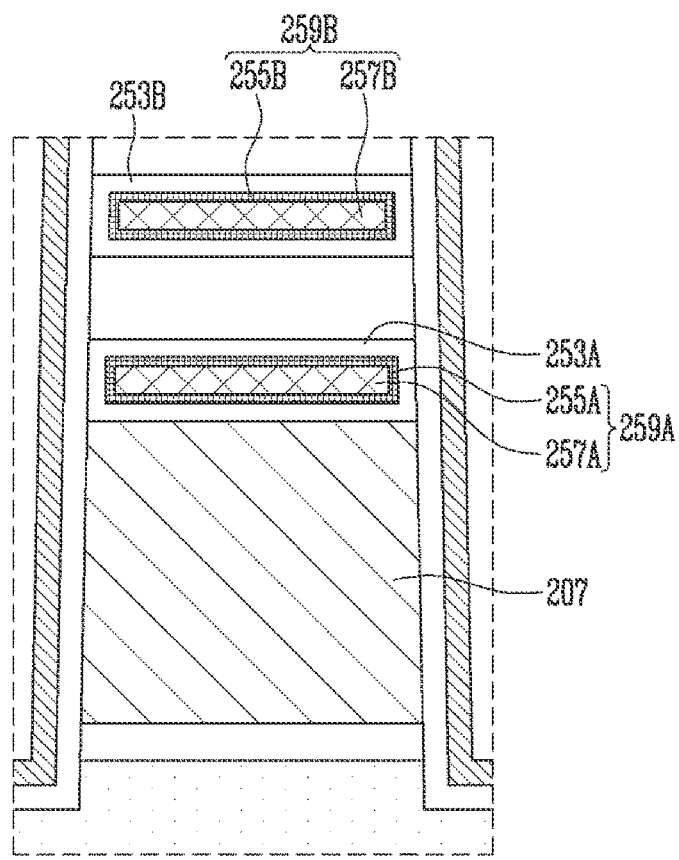

FIG. 10 is an enlarged view of region Y shown in FIG. 9C.

Referring to FIG. 10, the second select gate layer 259A may be surrounded by the first blocking insulating pattern 253A, and each of the conductive patterns 259B may be surrounded by a second blocking insulating pattern 253B corresponding thereto.

The second select gate layer 259A may include a metal layer 257A having a resistance lower than that of the first select gate layer 207 and a diffusion barrier layer 255A disposed between the metal layer 257A and the first blocking insulating pattern 253A. Each of the conductive patterns 259B may include same material layers as the second select gate layer 259A. That is, each of the conductive patterns 259B may include a metal layer 257B having a resistance lower than that of the first select gate layer 207 and a diffusion barrier layer 255B disposed between the metal layer 257B and the second blocking insulating pattern 253B.

In an embodiment, the metal layers 257A and 257B may include tungsten, and each of the diffusion barrier layers 255A and 255B may include Ti and TiN or include TiN.

Figure 11:
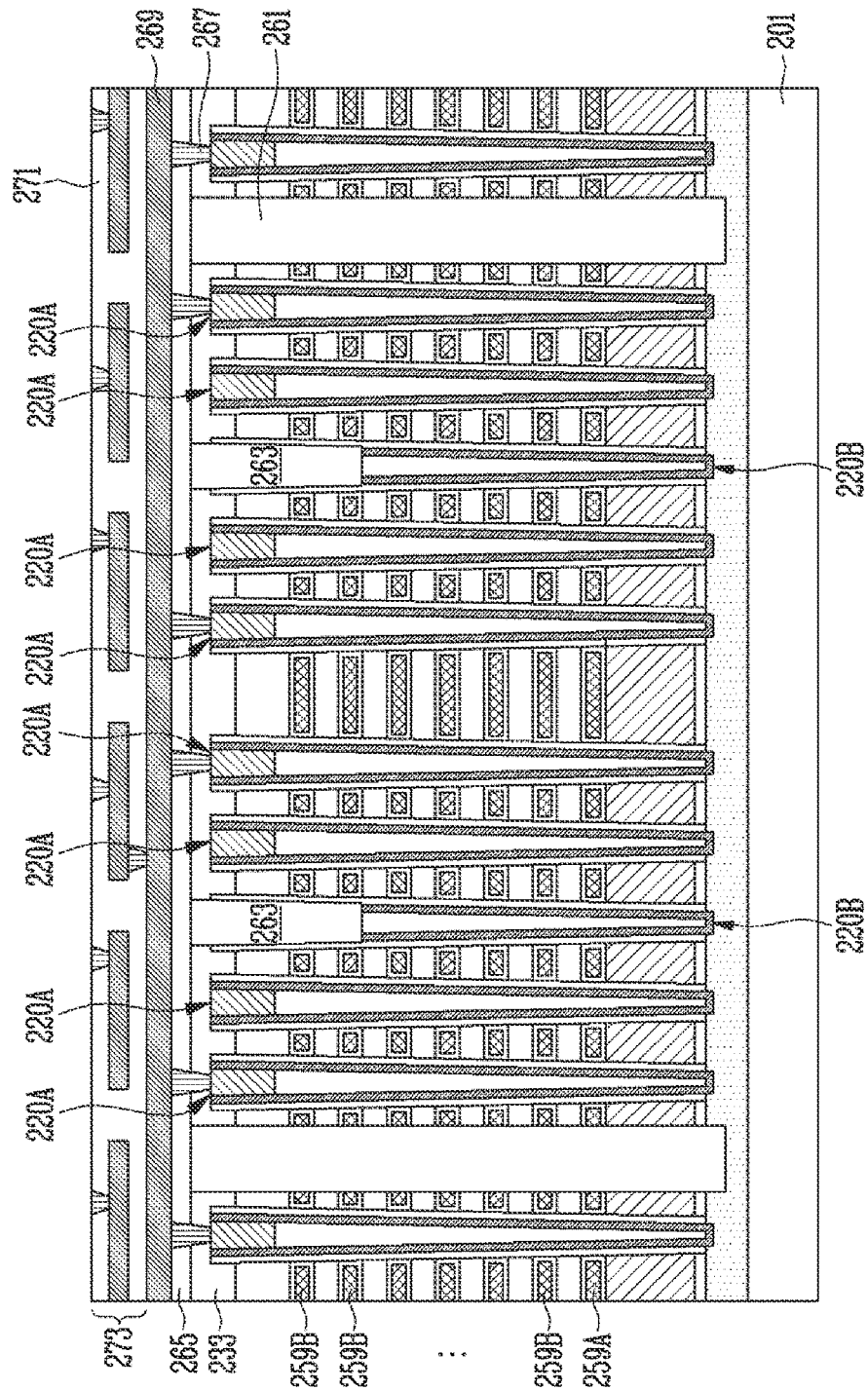

FIG. 11 is a sectional view illustrating a process of forming a bit line 269 and a process of forming first interconnection structures 273.

Referring to FIG. 11, before the bit line 269 is formed, the first slit 241A and the second slit 241B, which are shown in FIG. 9C, may be filled with a vertical structure 261. The vertical structure 261 may include an insulating material or include an insulating material and a conductive material penetrating the insulating material. Subsequently, drain select isolation structures 263 may be formed, which overlap with the dummy channel structures 220B. A conductive pattern disposed in at least an uppermost layer among the conductive patterns 259B may be isolated into drain select lines by the drain select isolation structures 263. The drain select isolation structure 263 may be omitted according to the design of the semiconductor memory device.

Subsequently, a second upper insulating layer 265 may be formed on the first upper insulating layer 233. The second upper insulating layer 265 may extend to cover the vertical structure 261. Subsequently, a contact plug 267 may be formed to penetrate the second upper insulating layer 265 and the first upper insulating layer 233 and may be connected to the corresponding channel structure 230A.

Subsequently, the bit line 269 connected to the contact plug 267 may be formed. The bit line 269 may be connected to the corresponding channel structure 220A via the contact plug 267.

After the bit line 269 is formed, the first interconnection structures 273 buried in the first insulating structure 271 may be formed on the bit line 269. One of the first interconnection structures 273 may be connected to the bit line 269.

Figure 12:
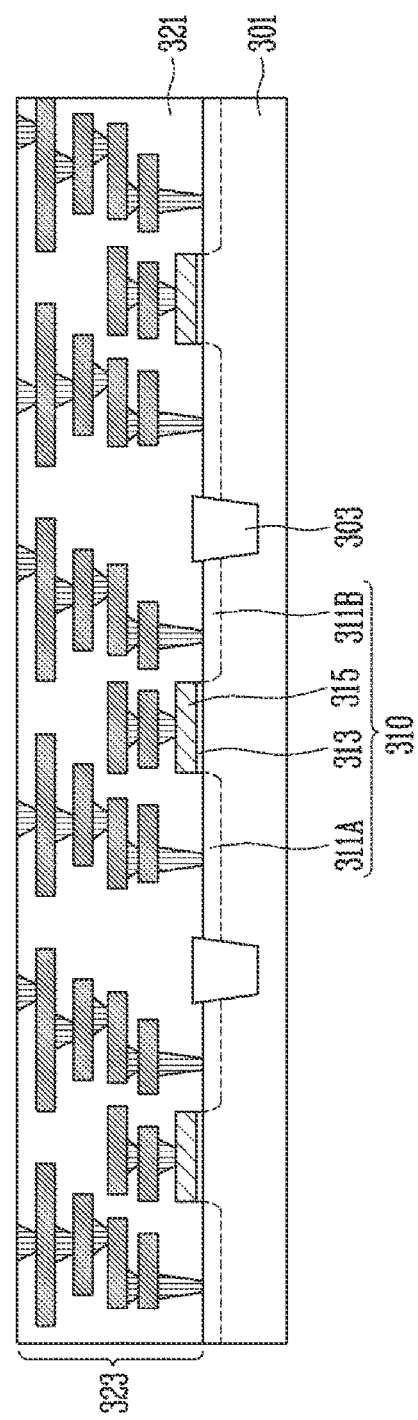

FIG. 12 is a sectional view illustrating transistors 310 of a peripheral circuit and second interconnection structures 323 connected to the transistors 310.

Referring to FIG. 12, a second substrate 301 may be provided. The second substrate 301 may include a plurality of transistors 310 constituting a peripheral circuit.

The second substrate 301 may be a bulk silicon substrate, a silicon on insulator substrate, a germanium substrate, a germanium on insulator substrate, a silicon-germanium substrate, or an epitaxial thin film formed through a selective epitaxial growth process.

The transistors 310 may be disposed in active regions of the second substrate 301, which are defined by isolation layers 303. Each of the transistors 310 may include a gate insulating layer 313 disposed on the corresponding active region, a gate electrode 315 disposed on the gate insulating layer 313, and junctions 311A and 311B formed in the active region at both sides of the gate electrode 315.

The second interconnection structures 323 may be formed on the second substrate 301 including the transistors 310. The second interconnection structures 323 may be buried in a second insulating structure 321 extending to cover the peripheral circuit including the transistors 310. Some of the second interconnection structures 323 may be connected to the transistors 310.

Figure 13:
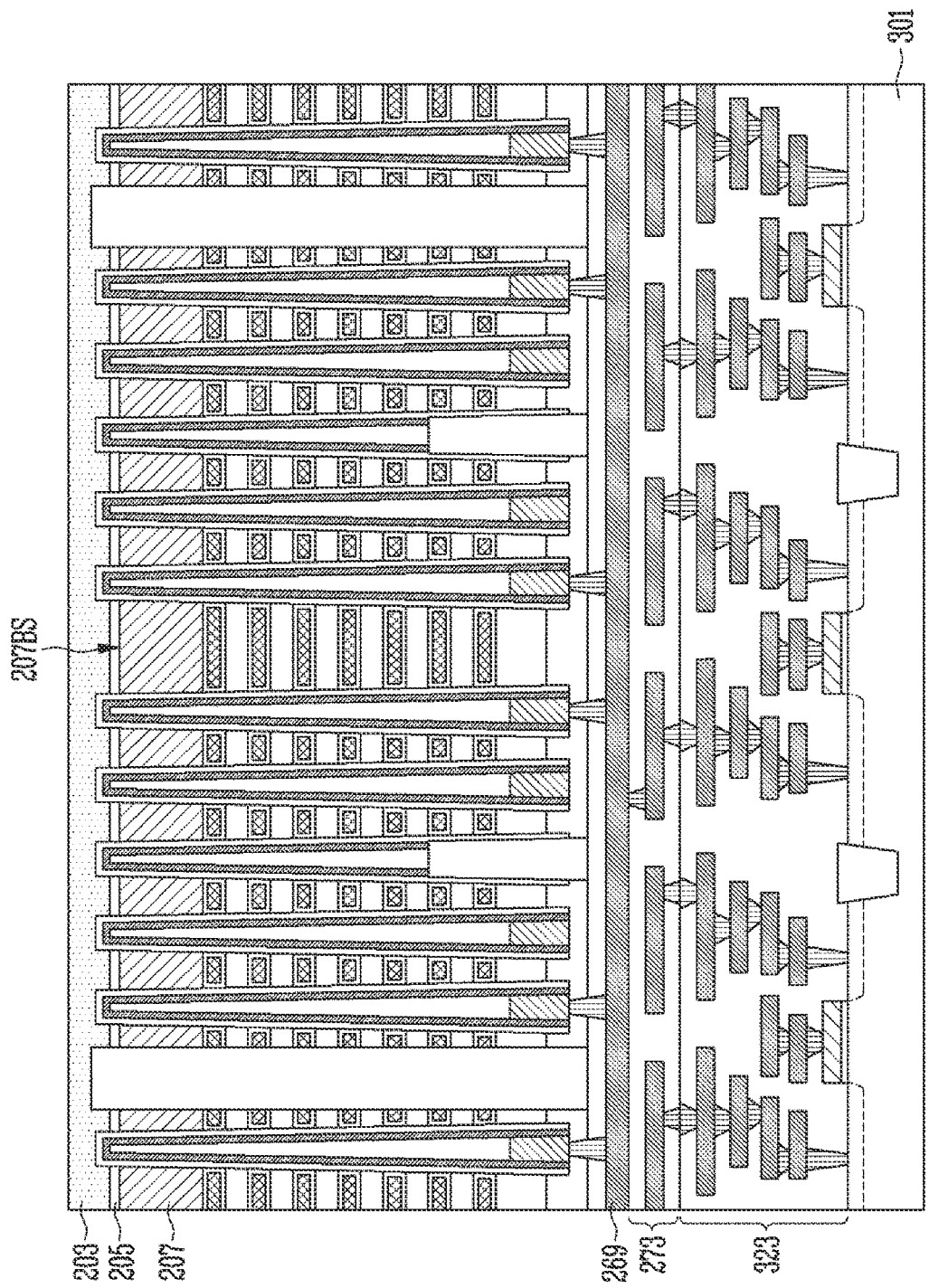

FIG. 13 is a sectional view illustrating a process of connecting the first interconnection structures 273 and the second interconnection structures 323 to each other and a process of removing the first substrate 201 shown in FIG. 11.

Referring to FIG. 13, the first substrate 201 shown in FIG. 11 may be aligned on the second substrate 301 such that the first interconnection structures 273 and the second interconnection structures 323 face each other. Subsequently, a bonding process may be performed such that the first interconnection structures 273 can be attached to the second interconnection structures 323 corresponding to the first interconnection structures 273.

Subsequently, the first substrate 201 shown in FIG. 11 may be removed such that the first protective layer 203 is exposed. The process of removing the first substrate 201 may include a polishing process, and the first protective layer 203 may serve as a stop layer when the polishing process is performed.

Figure 14:
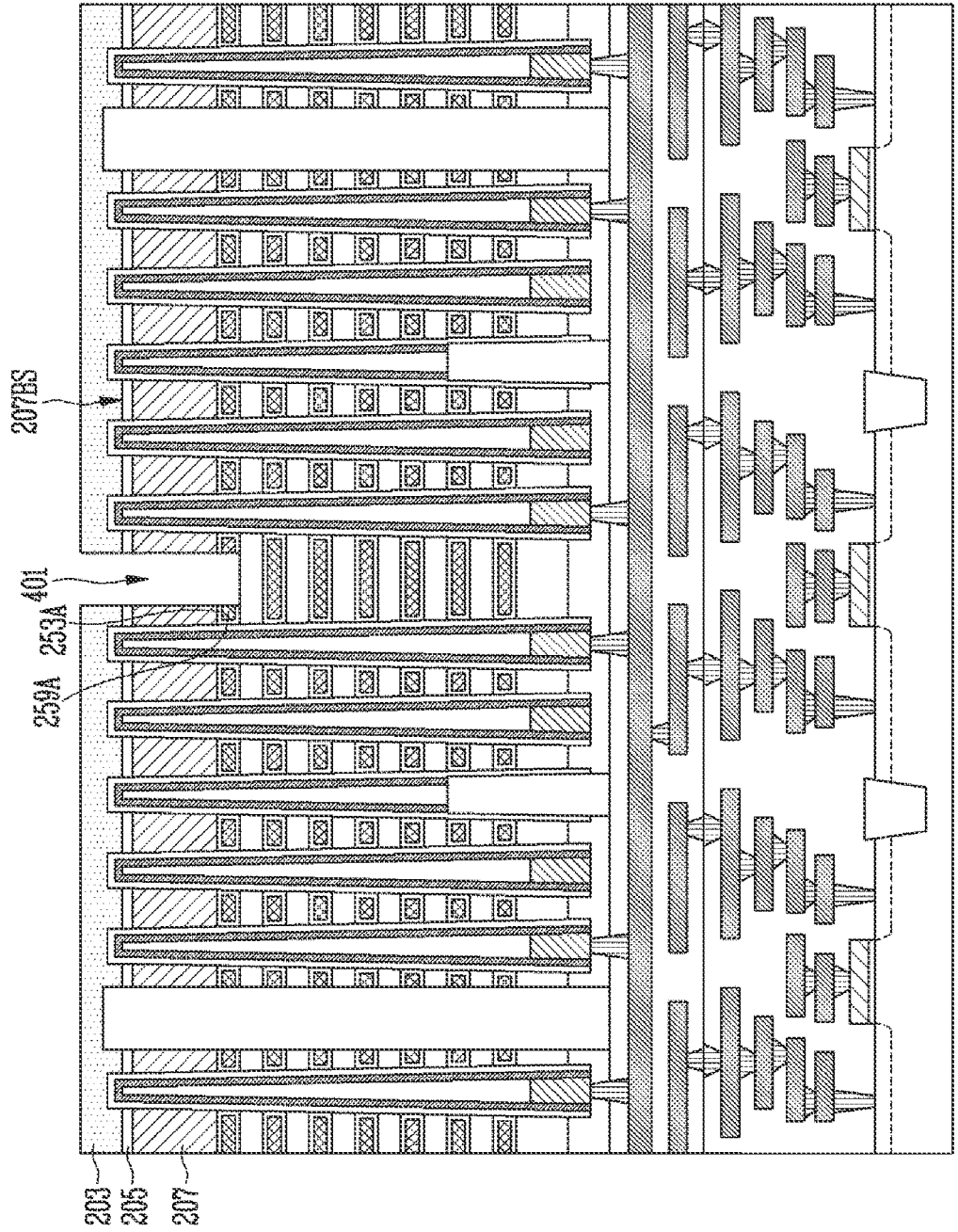

FIG. 14 is a sectional view illustrating a process of forming a third slit 401.

Referring to FIG. 14, each of the first select gate layer 207 and the second select gate layer 259A may be separated into source select lines by the third slit 401. The third slit 401 may be used as a path through which a portion of the first blocking insulating pattern 253A is replaced with a third select gate layer 411S shown in FIG. 15D. The third slit 401 may be formed by etching the first select gate layer 207 and the second select gate layer 259A from the bottom surface 207BS of the first select gate layer 207. The third slit 401 may extend to penetrate the first protective layer 203, the oxide layer 205, the first select gate layer 207, the first blocking insulating pattern 253A, and a second select gate layer 259A.

FIGS. 15A to 15D are enlarged sectional views illustrating a process of forming the third select gate layer 411S.

Figure 15A:
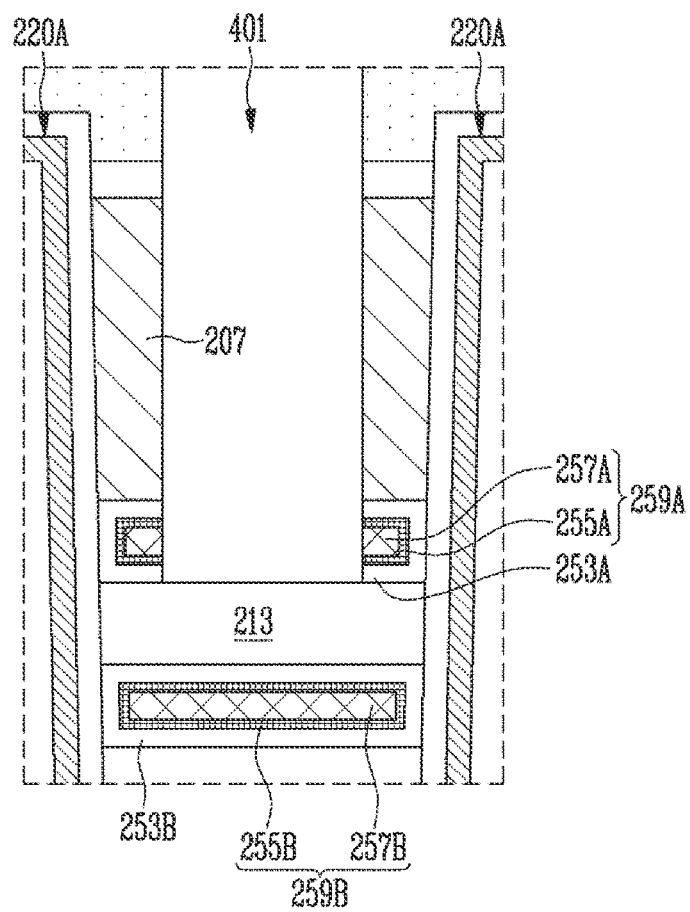

Referring to FIG. 15A, the first select gate layer 207, the first blocking insulating pattern 253A, and the diffusion barrier layer 255A of the second select gate layer 259A may be exposed between the channel structures 220A by the third slit 401. The third slit 401 may be formed to have a shallow depth in which the third slit 401 does not penetrate the interlayer insulating layers 213 and the second conductive patterns 259B. Thus, the level of difficulty of an etching process for forming the third slit 401 can be lowered.

Referring to FIG. 15B, a portion of the first blocking insulating pattern 253A shown in FIG. 15A may be removed through the third slit 401. In this time, a portion of the diffusion barrier layer 255A shown in FIG. 15A may be removed. Accordingly, an opening 403 may be defined between the metal layer 257A of the second select gate layer and the first select gate layer 207.

The diffusion barrier layer 255B and the second blocking insulating pattern 253B of each of the conductive patterns 259B may be protected by an interlayer insulating layer 213 disposed on a bottom surface of the third slit 401.

The memory layer 223A formed on a sidewall of each of channel structures 220A adjacent to the third slit 401 may be exposed by the opening 403. The channel layer 225A of each of the channel structures 220A may be blocked from the opening 403 by the memory layer 223A. The opening 403 may extend between the metal layer 257A of the second select gate layer and an interlayer insulating layer 213 adjacent to the metal layer 257A.

Referring to FIG. 15C, a connection layer 411 may be formed through the third slit 401 such that, the connection layer 411 may connect the first select gate layer 207 and the metal layer 257A of the second select gate layer. The connection layer 411 may be formed to fill the opening 403 shown in FIG. 15B.

The connection layer 411 may provide an ohmic contact between the first select gate layer 207 and the metal layer 257A of the second select gate layer; and include a material which can serve as a diffusion barrier for preventing diffusion of metal from the metal layer 257A. In an embodiment, the connection layer 411 may include titanium (Ti) and titanium nitride (TiN), include titanium nitride (TiN), or include a titanium silicide material (TiSi).

Figure 15D:
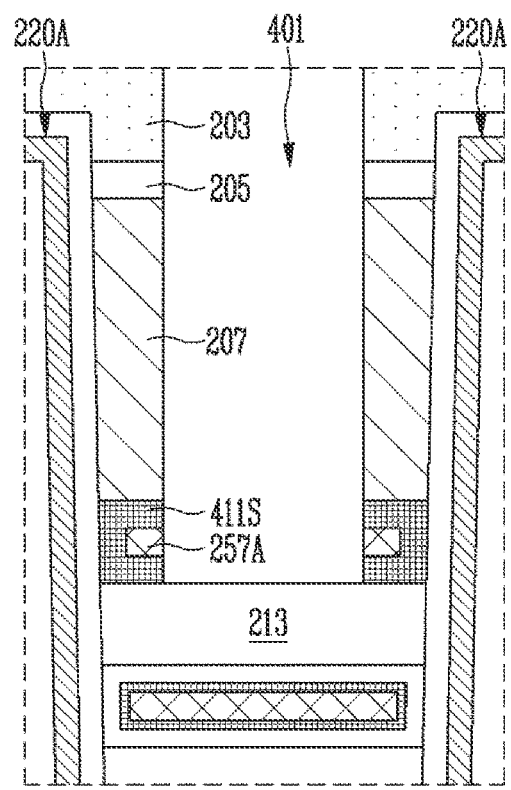

Referring to FIG. 15D, the interlayer insulating layer 213 may be exposed by removing a portion of the connection layer 411 in the third slit 401 shown in FIG. 15C. Accordingly, the connection layer 411 may be separated into third select gate layers 411S by the third slit 401, FIGS. 16A to 16C are sectional views illustrating a process of forming a common source line 423.

Figure 16A:
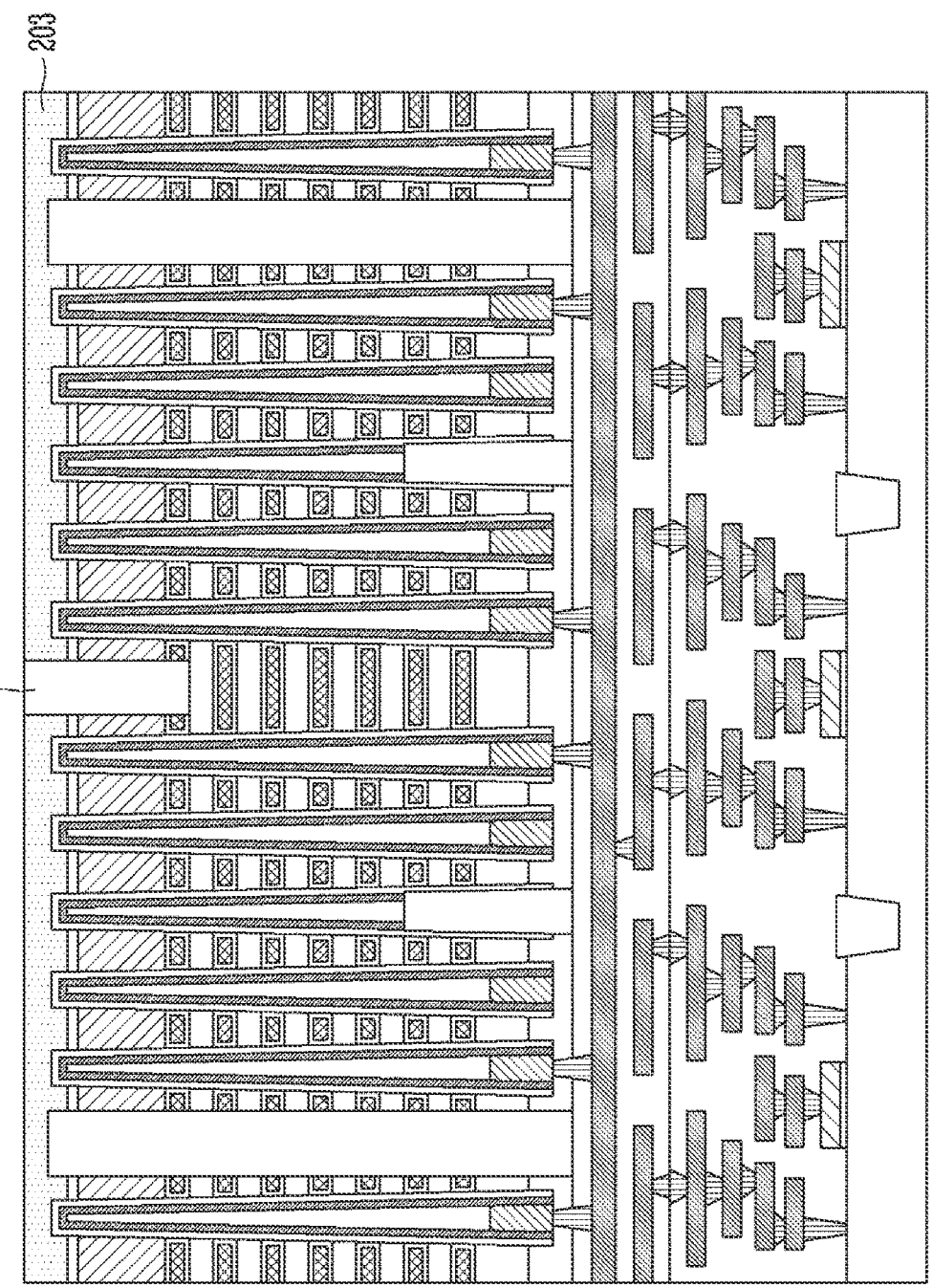

Referring to FIG. 16A, the third slit 401 shown in FIG. 15D may be filled with an insulating material 421.

Figure 16B:
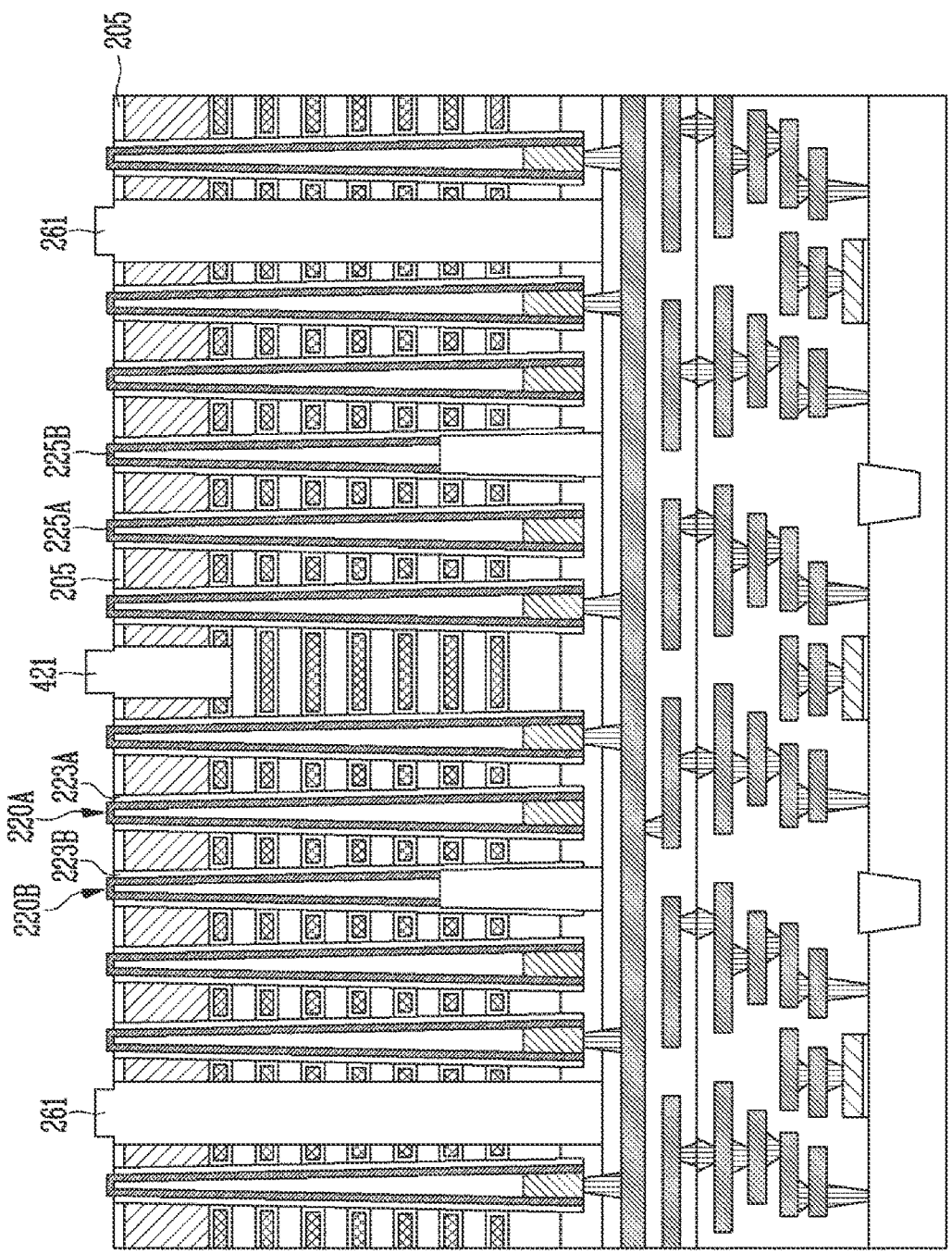
Figure 16C:
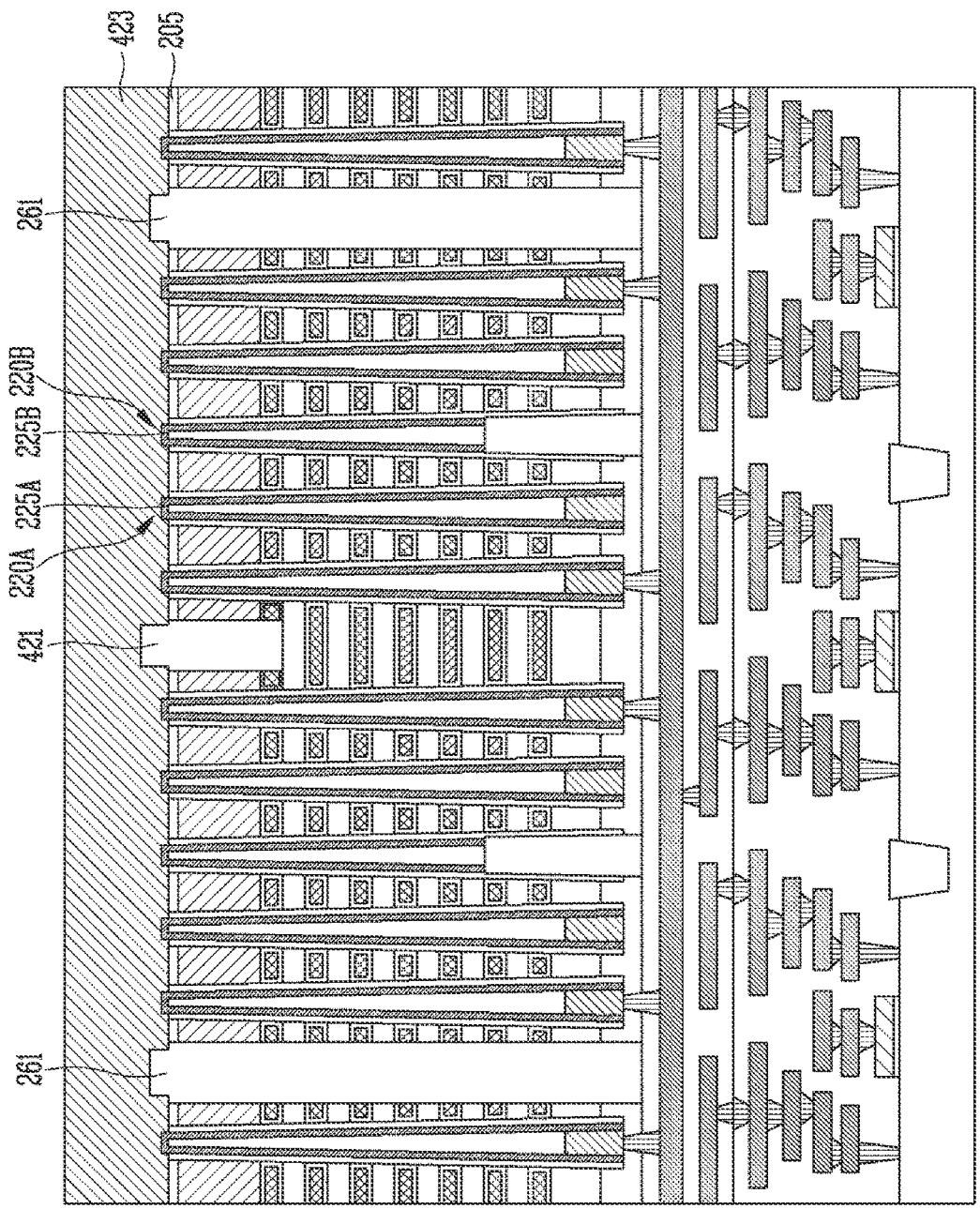

Referring to FIG. 16B, the first protective layer 203 shown in FIG. 16A may be removed such that the memory layer 223A is exposed. The oxide layer 205 and the dummy memory layer 223B may be exposed.

Subsequently, an exposed region of the memory layer 223A may be removed such that the channel layer 225A is exposed. In this time, an exposed region of the dummy memory layer 223B may be removed, and the dummy channel layer 225B may be exposed. In addition, a portion of the insulating material 421, a portion of the vertical structure 261, and a portion of the oxide layer 205 may be etched.

Subsequently, the oxide layer 205 may be etched to have a target thickness. The etched oxide layer 205 may be serve as a source gate insulating layer.

Referring to FIG. 16C, the common source line 423 connected to the channel layer 225A may be formed on the oxide layer 205. The dummy channel layer 225B may be connected to the common source line 423.

The common source line may extend to cover the vertical structure 261 and the insulating material 421. The common source line 423 may include a semiconductor layer including an impurity. In an embodiment, the common source line 423 may include a doped silicon layer including an n-type impurity.

The n-type impurity in the common source line 423 may be diffused into the channel layer 225A of each of the channel structures 220A. Accordingly, a junction overlap region may be defined at an end portion of the channel layer 225A, which is adjacent to the common source line 423.

Figure 17:
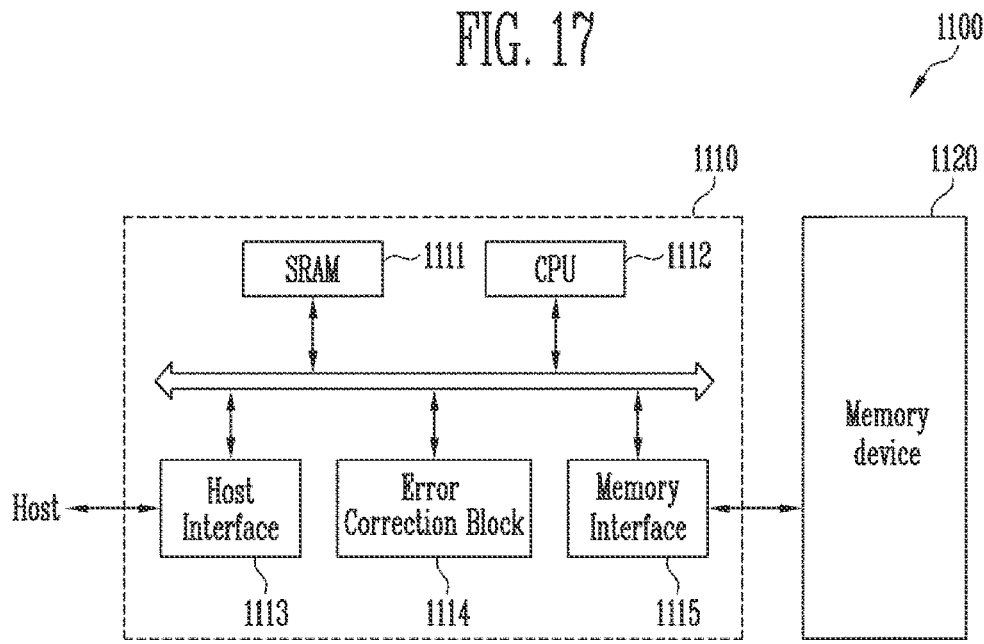
FIG. 17 is a block diagram illustrating a configuration of a memory system in accordance with an embodiment of the present disclosure.

FIG. 17 is a block diagram illustrating a configuration of a memory system 1100 in accordance with an embodiment of the present disclosure.

Referring to FIG. 17, the memory system 1100 includes a memory device 1120 and a memory controller 1110.

The memory device 1120 may include at least one of the source select lines described with reference to FIGS. 3, 4A, 4B, 5A, 5B, 6, and 7A to 7C. For example, the memory device 1120 may include source select lines isolated by a source select isolation structure, and each of the source select lines may include an end portion adjacent to the source select isolation structure. The end portion of each of the source select lines may include a first select gate layer overlapping with a cell stack structure, a second select gate layer disposed between the first select gate layer and the cell stack structure, and a third select gate layer disposed between the first select gate layer and the second select gate layer. The memory device 1120 may be a multi-chip package configured with a plurality of flash memory chips.

The memory controller 1110 controls the memory device 1120, and may include a Static Random Access Memory (SRAM) 1111, a Central Processing Unit (CPU) 1112, a host interface 1113, an error correction block 1114, and a memory interface 1115. The SRAM 1111 is used as an operation memory of the CPU 1112, the CPU 1112 performs overall control operations for data exchange of the memory controller 1110, and the host interface 1113 includes a data exchange protocol for a host connected with the memory system 1100. The error correction block 1114 detects and corrects an error included in a data read from the memory device 1120, and the memory interface 1115 interfaces with the memory device 1120. In addition, the memory controller 1110 may further include an ROM for storing code data for interfacing with the host, and the like.

The memory system 1100 configured as described above may be a memory card or a Solid State Drive (SSD), in which the memory device 1120 is combined with the memory controller 1110. For example, when the memory system 1100 is an SSD, the memory controller 1100 may communicated with the outside (e.g., the host) through one among various interface protocols, such as a Universal Serial Bus (USB) protocol, a Multi-Media Card (MMC) protocol, a Peripheral Component Interconnection (PCI) protocol, a PCI-Express (PCI-E) protocol, an Advanced Technology Attachment (ATA) protocol, a Serial-ATA (SATA) protocol, a Parallel-ATA (DATA) protocol, a Small Computer Small Interface (SCSI) protocol, an Enhanced Small Disk Interface (ESDI) protocol, and an Integrated Drive Electronics (IDE) protocol.

Figure 18:
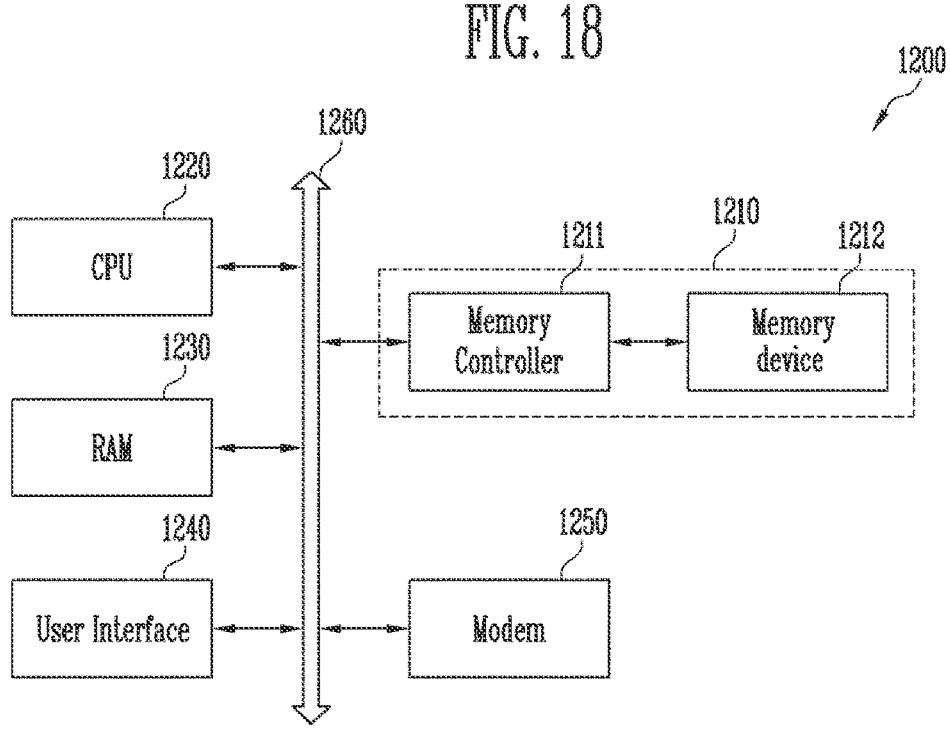
FIG. 18 is a block diagram illustrating a configuration of a computing system in accordance with an embodiment of the present disclosure.

FIG. 18 is a block diagram illustrating a configuration of a computing system 1200 in accordance with an embodiment of the present disclosure.

Referring to FIG. 18, the computing system 1200 in accordance with the embodiment of the present disclosure may include a CPU 1220, a random access memory (RAM) 1230, a user interface 1240, a modem 1250, and a memory system 1210, which are electrically connected to a system bus 1260. When the computing system 1200 is a mobile device, a battery for supplying an operation voltage to the computing system 1200 may be further included, and an application chip set, an image processor, a mobile DRAM, and the like may be further included.

The memory system 1210 may be configured with a memory device 1212 and a memory controller 1211 as described with reference to FIG. 17.

In accordance with the present disclosure, a select gate layer may be isolated into source select lines through a slit penetrating the select gate layer.

In accordance with the present disclosure, when the slit is formed, an etching process is performed from a bottom surface of the select gate layer by removing a substrate, so that the level of difficulty of the isolation process of the source select lines may be lowered.

What is claimed is:

1. A method of manufacturing a semiconductor memory device, the method comprising:
    forming a first select gate layer having a bottom surface facing a first substrate;
    forming a stack structure, wherein the stack structure includes a second select gate layer overlapping with the first select gate layer and interlayer insulating layers and conductive patterns, which are alternately stacked on the second select gate layer;
    removing the first substrate; and
    etching the first select gate layer and the second select gate layer from the bottom surface of the first select gate layer to form a slit penetrating the first select gate layer and the second select gate layer.

2. The method of claim 1, wherein the forming of the stack structure includes:
    alternately stacking sacrificial layers and the interlayer insulating layers on the first select gate layer;
    opening horizontal spaces by removing the sacrificial layers;
    forming a blocking insulating layer on a surface of each of the horizontal spaces; and
    forming a conductive material filling each of the horizontal spaces on a surface of the blocking insulating layer.

3. The method of claim 2, wherein the horizontal spaces include a first horizontal space filled with the second select gate layer and second horizontal spaces filled with the conductive patterns,
    wherein the slit extends to penetrate the blocking insulating layer disposed in the first horizontal space.

4. The method of claim 3, further comprising replacing the blocking insulating layer disposed in the first horizontal space with a third select gate layer through the slit.

5. The method of claim 2, further comprising forming a protective layer and an oxide layer on the first substrate, before the first select gate layer is formed,
    wherein the method further comprises:
    before the sacrificial layers are removed,
    forming a channel hole, wherein the channel hole penetrates the sacrificial layers, the interlayer insulating layers, the first select gate layer, and the oxide layer, and exposes the protective layer;
    forming a memory layer on a surface of the channel hole; and
    forming a channel structure filling the channel hole on the memory layer,
    wherein the slit penetrates the protective layer and the oxide layer.

6. The method of claim 5, further comprising:
    before the first substrate is removed,
    forming a bit line connected to the channel structure;
    forming a first interconnection structure connected to the bit line;

providing a second substrate including a peripheral circuit;

forming a second interconnection structure connected to the peripheral circuit; and bonding the second interconnection structure to the first interconnection structure.

7. The method of claim 5, wherein the removing of the first substrate is performed such that the protective layer is exposed.

8. The method of claim 5, further comprising:

forming a third select gate layer connecting the first select gate layer and the second select gate layer through the slit;

filling the slit with an insulating material;

removing the protective layer to expose the memory layer;

removing an exposed region of the memory layer to expose the channel structure; and forming a common source line on the oxide layer such that the common source line is connected to an exposed region of the channel structure.

* * * * *